(12) United States Patent
Bowman et al.

(10) Patent No.: US 9,012,127 B2
(45) Date of Patent: Apr. 21, 2015

(54) THERMOREVERSIBLE NETWORK SCAFFOLDS AND METHODS OF PREPARING SAME

(75) Inventors: Christopher Bowman, Boulder, CO (US); Christopher J. Kloxin, Newark, DE (US); Brian J. Adzima, Boulder, CO (US)

(73) Assignee: The Regents of the University of Colorado, a Body Corporate, Denver, CO (US)

( * ) Notice: Subject to any disclaimer, the term of this patent is extended or adjusted under 35 U.S.C. 154(b) by 17 days.

(21) Appl. No.: 13/820,608

(22) PCT Filed: Nov. 29, 2011

(86) PCT No.: PCT/US2011/062375
§ 371 (c)(1),
(2), (4) Date: May 14, 2013

(87) PCT Pub. No.: WO2012/074994
PCT Pub. Date: Jun. 7, 2012

(65) Prior Publication Data
US 2013/0244179 A1  Sep. 19, 2013

Related U.S. Application Data

(60) Provisional application No. 61/417,594, filed on Nov. 29, 2010.

(51) Int. Cl.
*G03F 7/26* (2006.01)
*C08F 234/02* (2006.01)
*C08G 61/12* (2006.01)
*B29C 41/22* (2006.01)
*G03F 7/00* (2006.01)
*G03F 7/038* (2006.01)
*G03F 7/38* (2006.01)

(52) U.S. Cl.
CPC .............. *C08F 234/02* (2013.01); *C08G 61/12* (2013.01); *B29C 41/22* (2013.01); *G03F 7/0037* (2013.01); *G03F 7/038* (2013.01); *G03F 7/38* (2013.01); *C08G 2261/46* (2013.01)

(58) Field of Classification Search
USPC .................. 430/325, 270.1, 311, 322, 283.1; 522/127
See application file for complete search history.

(56) References Cited

U.S. PATENT DOCUMENTS

| | | | |
|---|---|---|---|
| 3,262,990 | A | 7/1966 | Hurwitz et al. |
| 2009/0281250 | A1 | 11/2009 | DeSimone et al. |
| 2010/0285094 | A1 | 11/2010 | Gupta |

OTHER PUBLICATIONS

Kloxin, et al.Covalent Adaptable Networks (CANs): A Unique Paradigm in Cross-linked Polymers, Mar. 2010.*
International Search Report dated Apr. 5, 2012 for International Application No. PCT/US2011/062375.

* cited by examiner

*Primary Examiner* — Caleen Sullivan
(74) *Attorney, Agent, or Firm* — Saul Ewing LLP; Kathryn Doyle; Domingos J. Silva

(57) ABSTRACT

The invention includes a novel light-activated polymerizable composition, wherein reversible crosslinks may be converted into irreversible crosslinks using a fully controllable physical and/or chemical process. The invention further includes methods of photofixing a light sensitive material or patterning an article comprising a light sensitive material.

21 Claims, 10 Drawing Sheets

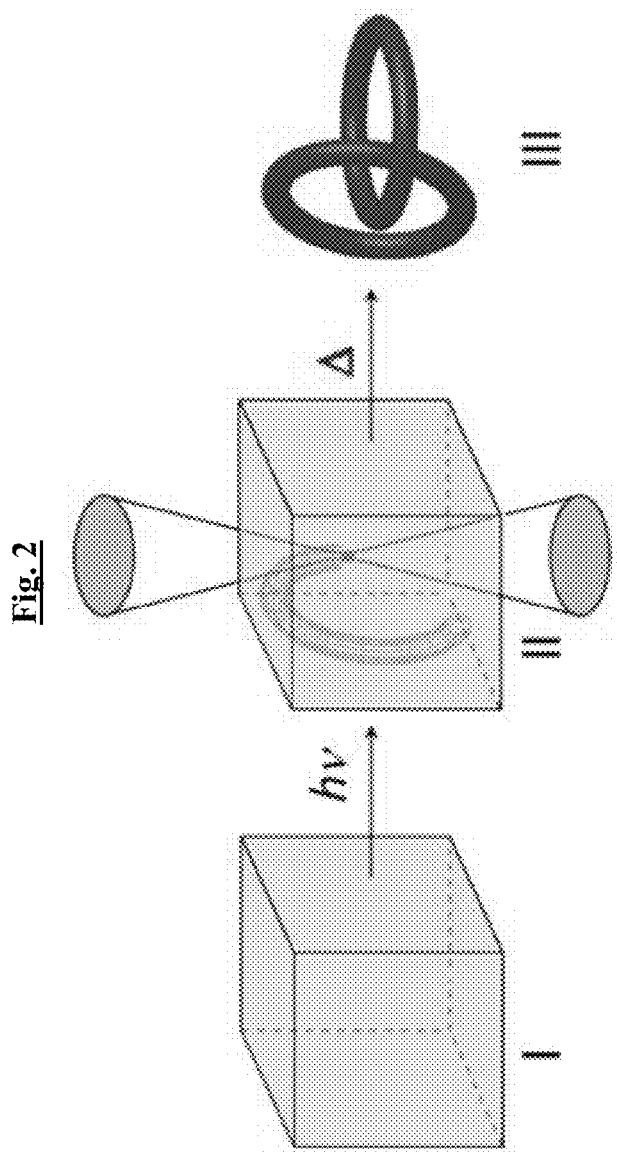

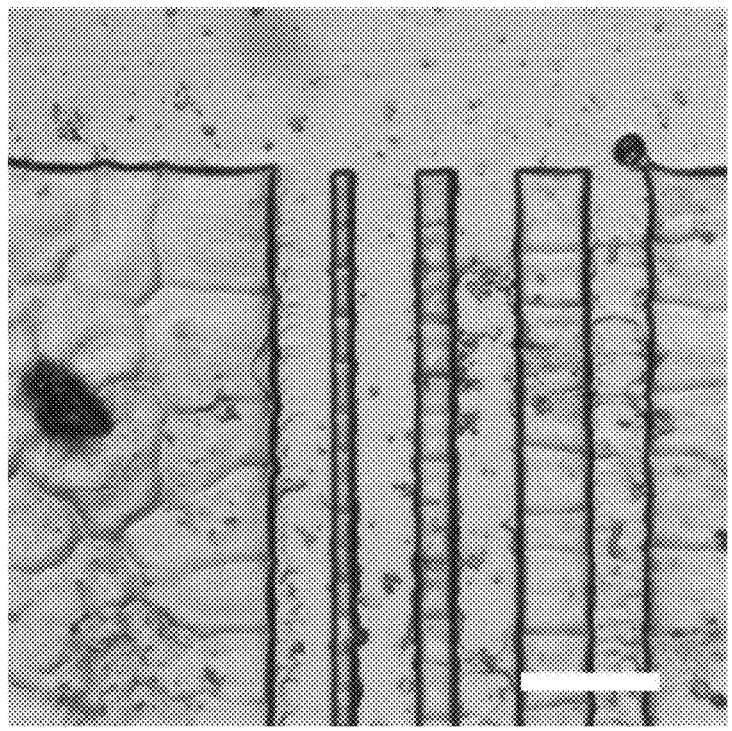

Fig. 6
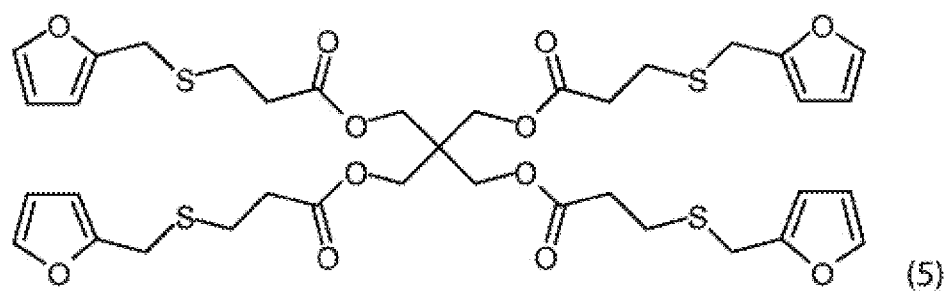
(5)
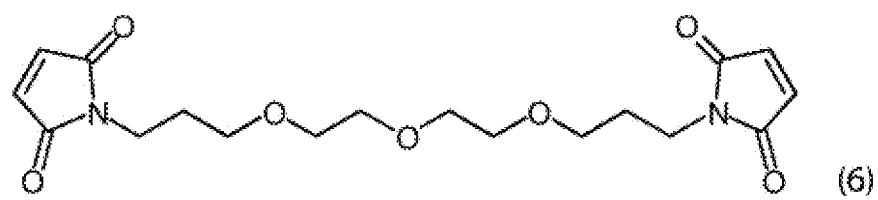
(6)
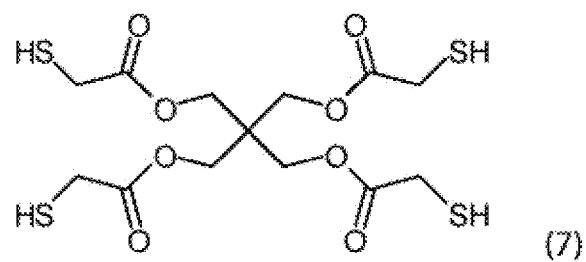
(7)
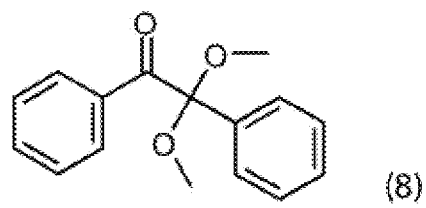
(8)

Fig. 7
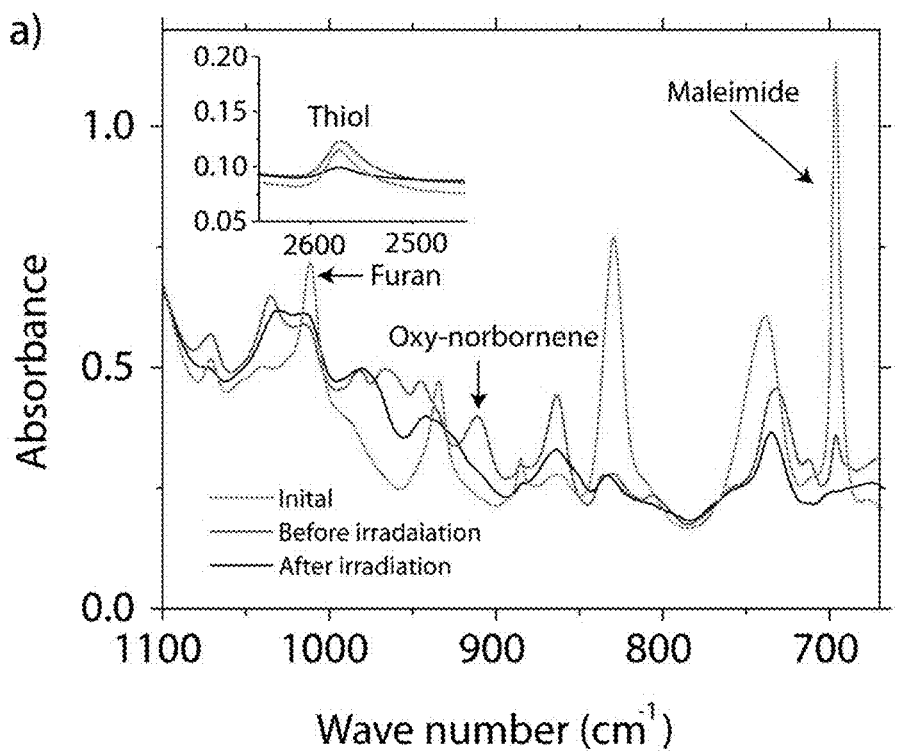
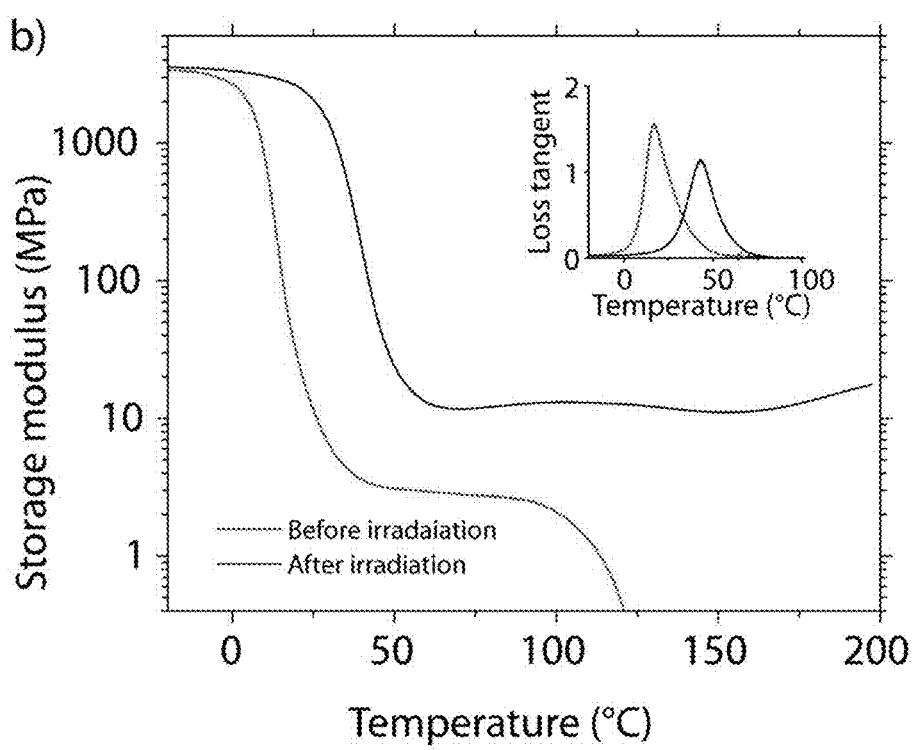

Fig. 9
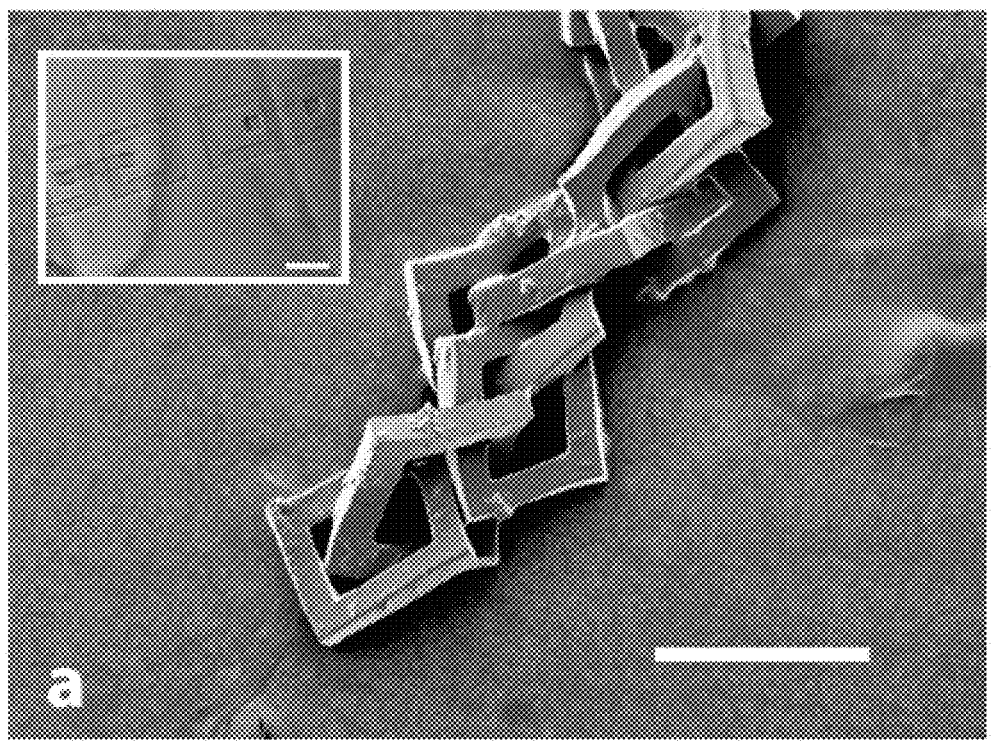
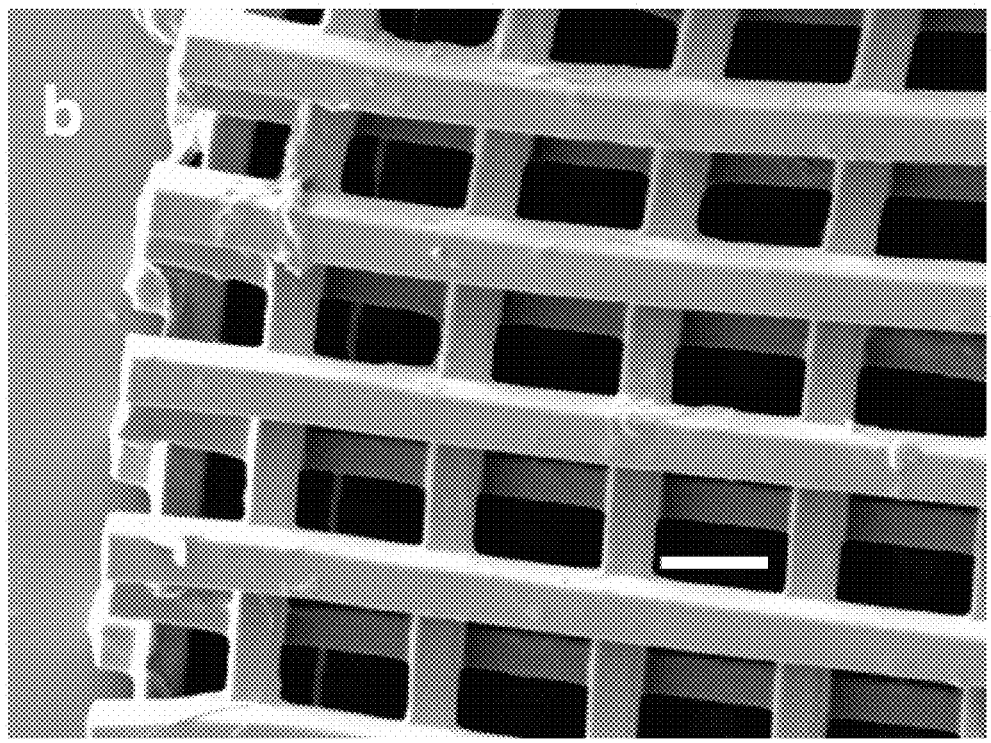

US 9,012,127 B2

THERMOREVERSIBLE NETWORK SCAFFOLDS AND METHODS OF PREPARING SAME

CROSS-REFERENCE TO RELATED APPLICATIONS

The present application is a 35 U.S.C. §371 national phase application of, and claiming priority to, International Application No. PCT/US2011/062375, filed Nov. 29, 2011, and published under PCT Article 21(2) in English, which claims priority under 35 U.S.C. §119(e) to U.S. Provisional Application No. 61/417,594, filed Nov. 29, 2010, all of which applications are hereby incorporated by reference in their entireties herein.

STATEMENT REGARDING FEDERALLY SPONSORED RESEARCH OR DEVELOPMENT

This invention was made with government support under Grant Number CBET0933828 awarded by the National Science Foundation. The government has certain rights in the invention.

BACKGROUND OF THE INVENTION

The ability to carry out photochemical reactions selectively and in a spatiotemporally controlled manner plays a key role in various modern technologies, including microfluidic devices (Duffy et al., 1998, Anal. Chem. 70 (23):4974-4984), metamaterials (Burckel et al., 2010, Adv. Mater. 22 (44): 5053-5057), artificial tissues (Khademhosseini & Langer, 2007, Biomat. 28 (34):5087-5092), parallel protein synthesis techniques (Fodor et al., 1991, Science 251 (4995):767-773), three-dimensional prototyping (Neckers, 1992, Polym. Eng. Sci. 32 (20):1481-1489), optical device fabrication, and microchip fabrication (Ito, in "Microlithography—Molecular Imprinting," Springer-Verlag Berlin, Berlin, 2005, Vol. 172, pp. 237-245).

Conventional photolithography begins with preparation of a photoactive thin film cast onto a substrate, typically using spin coating techniques, followed by application of heat to evaporate the solvent. A pattern is then transferred to the photoresist using actinic masked or focused laser light. The resulting image is developed by immersion in a solvent that selectively removes the undesired material. Photoresists are generally classified as being negative or positive tone resists (Ito, in "Microlithography—Molecular Imprinting," Springer-Verlag Berlin, Berlin, 2005, Vol. 172, pp. 37-245). Positive tone resists are rendered soluble by irradiation, typically due to degradation or modification of the polymer polarity, while negative tone resists utilize polymerization or crosslinking reactions to render them insoluble after irradiation.

While nano-imprint lithography and a variety of other techniques have emerged for the fabrication of two dimensional (2D) structures, the top-down construction of three dimensional (3D) structures still presents significant challenges. Arbitrary 3D shapes incorporating overhanging and free standing features are difficult, or impossible, to fabricate using current methodologies. Importantly, such structures are important for the development of photonic crystals (McElhanon et al., 2002, J. Appl. Polym. Sci. 85 (7):1496-1502), elastic metamaterials (Lai et al., Nature Mater 10 (8):620-624), and other critical micro devices.

3D structures are fabricated by tracing out a 3D pattern using modern optical direct write lithographic techniques, or through a tedious cycle of patterning, development, planarization and alignment of multiple sequential layers, each of which possesses its own 2D pattern (Lin et al., 1998, Nature 394 (6690):251-253; Liu et al., 2008, Nature Materials 7 (1):31-37). While direct writing reduces the total number of steps, it still presents significant challenges. First, 3D construction of non-contiguous objects in a liquid negative tone photoresist is often problematic. Unlike 2D lithography, 3D features must be built up layer by layer in a bath of liquid monomer when using a negative tone resist (Zhou et al., 2002, Science 296 (5570):1106-1109). Accordingly, each underlying layer must support the next layer, or overhanging features will sediment from the densification associated with the polymerization. Sedimentation is slowed by utilizing higher viscosity photoresists; however, this approach complicates the later removal of the unreacted resist while aiming to preserve fragile features. Alternative ablative techniques such as focused ion beam lithography share similar structural limitations, and freeform fabrication techniques, such as laser sintering, are limited in resolution and restricted to rapid prototyping of macroscopic objects such as machine tooling and artificial bone constructs (Leong et al., 2003, Biomat. 24 (13):2363-2378). Positive tone photoresists in conjugation with two-photon processes sometimes overcome this challenge to write channels and other hollow interconnected structures where minimal material needs to be removed (Jhaveri et al., 2009, Chem. Mat. 21 (10):2003-2006).

Macromolecular networks incorporating crosslinks formed by Diels-Alder cycloaddition have been reported in the scientific literature. Chen et al. reported thermally reversible Diels-Alder cycloaddition of a monomer with four furan moieties on each molecule and a monomer with three maleimide moieties on each molecule to form a highly-crosslinked network (Science 2002, 295:1698). After casting of a dichloromethane solution of the monomers (with stoichiometric furan-maleimide ratio), the solvent was vacuum evaporated at room temperature and the material was then heated. Crosslinking of furan side chain polymers with bis-maleimide-containing small molecules has also been reported (Sanyal, 2010, Macromol. Chem. Phys. 211:1417-1425).

Further, use of Diels-Alder crosslinked films for nanoscale probe lithography and data storage has been reported (Gotsmann et al., 2006, Adv. Funct. Mater. 16(11):1499-1505). U.S. Patent Application Publication No. 2009/0100553 discloses a scanning probe-based lithography method in which patterning of a resist medium is produced by Atomic Force Microscope probe-surface contact. In this report, the resist may be an organic polymer in which polymer chains are connected to each other with Diels-Alder adducts.

Polymer networks incorporating pendant Diels-Alder adducts have been described in the literature. Kosif et al. reported formation of a cross-linked polymer with pendant furan protected maleimide groups via gelation of a furan protected maleimide containing methacrylate monomer with a polyethylene glycol methacrylate monomer (Kosif et al., 2010, Macromolecules 43:4140-4148). After gelation, the protected maleimide groups were reportedly activated to their reactive forms via a thermal cycloreversion step. The dried hydrogel was added to a solution containing a fluorescent dye or a thiolated biotin derivative.

There is a need in the art for novel light-activated polymerizable compositions, wherein reversible crosslinks may be converted into irreversible crosslinks using a fully controllable physical or chemical process. Such compositions may be useful for photolithographic and 2D/3D prototyping applications. The present invention fulfills this need.

BRIEF SUMMARY OF THE INVENTION

The invention includes a composition comprising at least one reversibly crosslinked polymer and at least one fixing molecule, wherein the at least one reversibly crosslinked polymer comprises at least one crosslink, wherein the at least one crosslink is formed by a reversible crosslinking reaction and comprises at least one chemical group that may react with the fixing molecule, wherein the reaction between the fixing molecule and the at least one chemical group of the at least one crosslink prevents the at least one crosslink from undergoing the reverse crosslinking reaction, wherein the composition optionally further comprises at least one photoinitiator.

In one embodiment, the at least one crosslink comprises an adduct, the adduct is formed by a Diels-Alder reaction between a diene-containing reactant and a dienophile-containing reactant, and the at least one chemical group of the crosslink is the double bond formed by the Diels-Alder reaction. In another embodiment, the diene-containing reactant comprises a diene selected from the group consisting of furan, cyclopentadiene, fulvene, anthracene, acyclic cis-1,3-butadiene, and combinations thereof. In yet another embodiment, the dienophile-containing reactant comprises a dienophile selected from the group consisting of maleimide, cyclopentadiene, cyanoethene, and combinations thereof. In yet another embodiment, the reaction between the fixing molecule and the at least one chemical group of the at least one crosslink is catalyzed, triggered or induced by electromagnetic irradiation. In yet another embodiment, the fixing molecule comprises a thiol group. In yet another embodiment, the photoinitiator comprises a Type (I) or Type (II) photoinitiator.

The invention includes a method of photofixing a section of a light sensitive material. The method includes the step of providing a light sensitive material comprising at least one reversibly crosslinked polymer and at least one fixing molecule, wherein the at least one reversibly crosslinked polymer comprises at least one reversible covalent crosslink, wherein the material optionally further comprises at least one photoinitiator. The method further includes the step of exposing a section of the material to electromagnetic radiation for a given period of time and at given intensity as to induce a fixing reaction between the at least one reversible covalent crosslink and the at least one fixing molecule, wherein the fixing reaction causes a covalent modification of the at least one reversible covalent crosslink and prevents the at least one reversible covalent crosslink from undergoing the reverse crosslinking reaction, whereby the section of the light sensitive material is photofixed.

In one embodiment, the at least reversible covalent crosslink comprises a Diels-Alder adduct, wherein the adduct is formed by a reaction between a diene-containing reactant and a dienophile-containing reactant. In another embodiment, the diene-containing reactant comprises a diene selected from the group consisting of furan, cyclopentadiene, fulvene, anthracene, acyclic cis-1,3-butadiene, and combinations thereof. In yet another embodiment, the dienophile-containing reactant comprises a dienophile selected from the group consisting of maleimide, cyclopentadiene, cyanoethene, and combinations thereof. In yet another embodiment, the fixing molecule comprises a thiol group. In yet another embodiment, the photoinitiator comprises a Type (I) or Type (II) photoinitiator.

The invention also includes a method of patterning an article, wherein the article comprises a light sensitive material. The method comprises the step of (i) providing a first light sensitive composition comprising at least one reversibly crosslinked polymer and at least one fixing molecule, wherein the at least one reversibly crosslinked polymer comprises at least one reversible covalent crosslink, wherein the composition optionally further comprises at least one photoinitiator. The method further comprises the step of (ii) exposing a section of the first light sensitive composition to electromagnetic radiation for a given period of time and at given intensity as to induce a fixing reaction between the at least one reversible covalent crosslink and the fixing molecule, wherein the fixing reaction causes a covalent modification of the at least one reversible covalent crosslink and prevents the at least one reversible covalent crosslink from undergoing the reverse crosslinking reaction, thereby generating an article wherein the section of the first light sensitive composition is photofixed. The method further comprises the optional step of (iii) performing the steps of: providing at least one additional light sensitive composition comprising at least one reversibly crosslinked polymer and at least one fixing molecule, wherein the at least one reversibly crosslinked polymer comprises at least one reversible covalent crosslink, wherein the composition optionally further comprises at least one photoinitiator; contacting the at least one additional light sensitive composition with the article of step (ii) as to generate a modified article; exposing a section of the modified article to electromagnetic radiation for a given period of time and at given intensity as to induce a fixing reaction between the at least one reversible covalent crosslink and the fixing molecule, wherein the fixing reaction causes a covalent modification of the at least one reversible covalent crosslink and prevents the at least one reversible covalent crosslink from undergoing the reverse crosslinking reaction, whereby the section of the modified article material is photofixed; and, repeating step (iii) until an article of desired shape and composition is prepared. The method further comprises the step of (iv) submitting the article of step (ii) or (iii) to a depolymerization process which induces the material that is not photofixed to undergo a reverse crosslinking reaction, thereby generating depolymerized material. The method further comprises the step of (v) removing the depolymerized material from the article, thereby generating pattern features in the article.

In one embodiment, the at least one reversible covalent crosslink comprises a Diels-Alder adduct, wherein the adduct is formed by a reaction between a diene-containing reactant and a dienophile-containing reactant. In another embodiment, the diene-containing reactant comprises a diene selected from the group consisting of furan, cyclopentadiene, fulvene, anthracene, acyclic cis-1,3-butadiene, and combinations thereof. In yet another embodiment, the dienophile-containing reactant comprises a dienophile selected from the group consisting of maleimide, cyclopentadiene, cyanoethene, and combinations thereof. In yet another embodiment, the fixing molecule comprises a thiol group. In yet another embodiment, the photoinitiator comprises a Type (I) or Type (II) photoinitiator. In yet another embodiment, the depolymerization process of step (iv) comprises heating, cooling, application of electromagnetic radiation, vacuum treatment, solvent extraction, and combinations thereof. In yet another embodiment, the removing of the depolymerized material of step (v) comprises solvent extraction, vacuum treatment, heating, and combinations thereof.

BRIEF DESCRIPTION OF THE DRAWINGS

For the purpose of illustrating the invention, there are depicted in the drawings certain embodiments of the invention. However, the invention is not limited to the precise arrangements and instrumentalities of the embodiments depicted in the drawings.

FIG. 2 is a schematic illustration of a 3D prototyping process, where (I) the thermoreversible scaffold is set via the Diels-Alder crosslinking reaction; (II) focused laser light initiates the photofixation reaction, locking in the structure; and (III) the material is heated to remove the unexposed sections yielding the 3D direct-written structure.

FIG. 3, comprising FIG. 3A illustrates the data for initial mixing of the monomers. FIG. 3B illustrates the data for the irradiation reaction.

FIG. 4 illustrates an image of a spincast film of trisfuran, bismaleimide, and tetrakisthiol monomers UV irradiated through a mask.

FIG. 6 illustrates specific chemical structures: tetrakis furfurylthiopropionate (5); 1,13-bismaleimido 4,7,10-trioxamidecane (6); pentaerythritol tetrakis 3-mercaptopropionate (7); and 2,2-dimethoxy-1,2-diphenylethanone (8).

FIG. 7, comprising FIGS. 7A-7B, is a set of graphs illustrating spectroscopic and mechanical characterization. FIG. 7A: The initial FTIR spectrum of a stoichiometric mixture of (5), (6), (7), and (8) showed infrared absorption peaks characteristic of maleimide, furan, and thiol (696, 1012, and 2571 $cm^{-1}$). After curing for 12 hours at 80° C., a peak indicative of the oxynorbornene appeared at 911 $cm^{-1}$, while the maleimide and furan peaks had decreased in intensity. Comparison to the initial spectrum suggested 86% of the furan and 88% of the maleimide have reacted, while less than 1% of the thiol remains is consumed (inset). After irradiation with 365 nm light at an intensity of 10 mW/cm² for 10 minutes, the oxynorbornene and maleimide peaks vanished, and 70% of the thiol was consumed. FIG. 7B: Dynamic mechanical analysis showed that, when heated to temperatures greater than 100° C., the unreacted material could relax and flow via breakage of the Diels-Alder adducts. Once the thiol-ene reaction occurred, this behavior largely ceased, although a slight decrease in the modulus was noted at approximately 150° C. The reaction of the thiol also resulted in an increase in crosslinking density and an elevation of the glass transition temperature (inset).

FIG. 9 illustrates patterning of interlocked rings and a logpile type structure. FIG. 9A: An SEM micrograph showed a set of 8 freely rotating rings written using two-photon techniques and developed by heating in furfuryl alcohol (200 µm scale bar). An inset optical micrograph demonstrated that the index change could be immediately visualized as seen by two sets of interlocking rings still contained in the surrounding polymer scaffold (200 µm scale bar). FIG. 9B: An SEM micrograph of a five layer log pile type structure (40 µm scale bar).

DETAILED DESCRIPTION OF THE INVENTION

Figure 1:
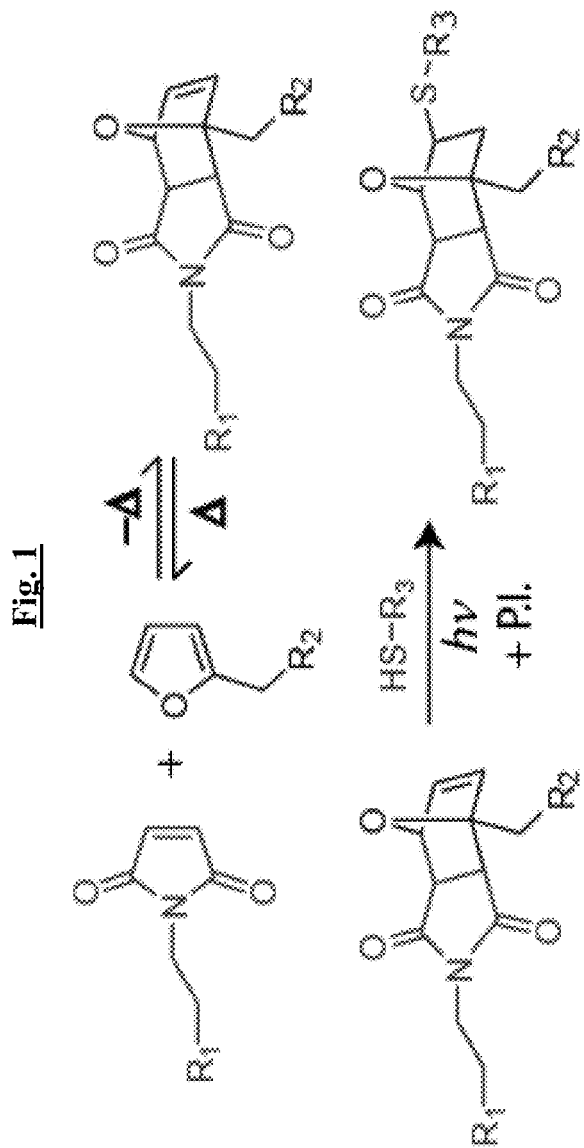
FIG. 1 comprises an illustration of (top reaction) a thermoreversible Diels-Alder reaction, the adduct of which can be used to form a reversible crosslink, and (bottom reaction) a thiol-ene photofixing reaction with the adduct illustrated in the top reaction.

The invention relates to the unexpected discovery of a reversibly crosslinked polymer scaffold that may be converted to an irreversibly crosslinked polymer (or "fixed" polymer) via a fixation reaction between the reversibly crosslinked polymer with a fixing molecule. The invention may be used to perform 2D/3D patterning of complex structures, which are otherwise intractable by current patterning methodologies. In one embodiment, the fixation reaction is a photofixation reaction.

The invention overcomes the limitations to conventional 2D/3D photolithography by developing a novel materials approach in which it is possible to photolithography create arbitrary 2D/3D structures within a thermoreversible polymer scaffold. While conventional chemically-crosslinked networks (i.e., thermosets) are insoluble, infusible, and cannot be readily manipulated, networks formed using reversible reactions may be triggered to readily depolymerize. Utilizing a photofixation reaction, these reversible crosslinks are transformed into irreversible junctions. Thus, pattern transfer is performed within a reversible scaffold that supports arbitrarily complex 2D/3D structures, and the desired 2D/3D image is developed simply by triggering the depolymerization reaction in the unexposed regions.

In one embodiment, the polymer network is part of a light-sensitive material comprising a plurality of fixing molecules and optional photoinitiator molecules distributed throughout the material. In another embodiment, the thermoreversibly crosslinked polymer network is formed by a Diels-Alder reaction between multifunctional furan- and maleimide-containing reactants, and a subsequent spatio-selective photofixation thiol-ene reaction creates well-defined irreversible regions within the material. Release of the patterned structure in the exposed region is achieved by reversion of the remaining reversible crosslinks to the corresponding reactants.

In one embodiment, the invention provides light sensitive materials comprising fixing molecules and a reversibly crosslinked polymer network comprising a plurality of reversible covalent crosslinks. In another embodiment, the reversible covalent crosslinks of the present invention comprise Diels-Alder adducts. In yet another embodiment, the reversible covalent crosslinks are thermally reversible and form at a first temperature range in which the forward Diels-Alder reaction occurs and are capable of being severed upon heating to a second temperature range in which the retro Diels-Alder reaction occurs. Other conditions may be used to effect the retro Diels-Alder reaction, including the use of a suitable solvent. As a consequence of Le Chatelier's principle, sufficient dilution of the adduct shifts equilibrium to favor the reverse reaction. This behavior has been exploited to affect the reversion of highly functionalized linear polymers, which would be otherwise difficult to ungel (Goiti, 2003, Macromolecular Rapid Communications, 24 (11):692-696).

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in cell culture, molecular genetics, organic chemistry, and peptide chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

As used herein, the term "comprising" includes "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements.

As used herein, the term "polymer" refers to a molecule composed of repeating structural units typically connected by covalent chemical bonds. The term "polymer" is also meant to include the terms copolymer and oligomers.

As used herein, the term "polymerization" refers to at least one reaction that consumes at least one functional group in a monomeric molecule (or monomer), oligomeric molecule (or oligomer) or polymeric molecule (or polymer), to create at least one chemical linkage between at least two distinct molecules (e.g., intermolecular bond), at least one chemical linkage within the same molecule (e.g., intramolecular bond), or any combination thereof. A polymerization reaction may consume between about 0% and about 100% of the at least one functional group available in the system. In one embodiment, polymerization of at least one functional group results in about 100% consumption of the at least one functional group. In another embodiment, polymerization of at least one functional group results in less than about 100% consumption of the at least one functional group.

As used herein, the term "reversibly crosslinked" as applied to a polymer refers to a polymer that is crosslinked intermolecularly or intramolecularly through a reversible chemical reaction.

As used herein, the term "crosslinking reaction" as applied to a reversible crosslinking reaction refers to the reaction direction in which the crosslinks are formed. In the case of a Diels-Alder reaction, the crosslinking reaction is the reaction of the diene and dienophile to form the corresponding Diels-Alder adduct.

As used herein, the term "reverse crosslinking reaction" as applied to a reversible crosslinking reaction refers to the reaction direction in which the crosslinks are broken. In the case of a Diels-Alder reaction, the reverse crosslinking reaction is the dissociation of the Diels-Alder adduct into the corresponding diene and dienophile.

As used herein, a "diene" group is a conjugated π system with 4 π electrons.

As used herein, the term "diene-containing reactant" refers to a molecule comprising a diene group (such as a furan or furan derivative group) in its structure.

As used herein, a "dienophile" group is a conjugated π system with 2 π electrons.

As used herein, the term "dienophile-containing reactant" refers to a molecule comprising a dienophile group (such as a maleimide or a maleimide derivative group) in its structure.

As used herein, the term "fixation reaction" refers to a chemical reaction between a fixing molecule and an adduct formed by a reversible reaction, whereupon the adduct cannot any longer undergo the reverse reaction because the fixation reaction took place.

As used herein, the term "photofixation" refers to a light-activated process used to convert reversible crosslinks into irreversible crosslinks in a cross-linked polymer.

As used herein, the term "Michael addition" refers to the nucleophilic addition of a carbanion or another nucleophile to an α,β-unsaturated carbonyl compound to form a β-substituted carbonyl compound.

As used herein, the term "electromagnetic radiation" includes radiation of one or more frequencies encompassed within the electromagnetic spectrum. Non-limiting examples of electromagnetic radiation comprise gamma radiation, X-ray radiation, UV radiation, visible radiation, infrared radiation, microwave radiation, radio waves, and electron beam (e-beam) radiation. In one aspect, electromagnetic radiation comprises ultraviolet radiation (wavelength from about 10 nm to about 400 nm), visible radiation (wavelength from about 400 nm to about 750 nm) or infrared radiation (radiation wavelength from about 750 nm to about 300,000 nm). Ultraviolet or UV light as described herein includes UVA light, which generally has wavelengths between about 320 and about 400 nm, UVB light, which generally has wavelengths between about 290 nm and about 320 nm, and UVC light, which generally has wavelengths between about 200 nm and about 290 nm. UV light may include UVA, UVB, or UVC light alone or in combination with other type of UV light. In one embodiment, the UV light source emits light between about 350 nm and about 400 nm. In some embodiments, the UV light source emits light between about 400 nm and about 500 nm.

As used herein, the term "reactive" as applied to a chemical group regarding a reaction indicates that this group, when submitted to appropriate conditions, may take part in the reaction in question.

As used herein, the term "scaffold" refers to a two-dimensional or a three-dimensional supporting framework. A scaffold can form a two- or three-dimensional structure of controlled mesh size. A monolayer is a non-limiting exemplary two-dimensional structure.

As used herein, the term "thiol group" refers to a —SH group.

As used herein, the term "Type (I) photoinitiator" refers to a compound that undergoes a unimolecular bond cleavage upon irradiation to yield free radicals. Non-limiting examples of Type (I) photoinitiators are benzoin ethers, benzyl ketals, α-dialkoxy-acetophenones, α-hydroxy-alkylphenones, α-amino-alkylphenones and acyl-phosphine oxides.

As used herein, the term "Type (II) photoinitiator" refers to a combination of compounds that undergo a bimolecular reaction where the excited state of the photoinitiator interacts with a second molecule (often known as "co-initiator") to generate free radicals.

As used herein, the term "instructional material" includes a publication, a recording, a diagram, or any other medium of expression that may be used to communicate the usefulness of the compositions of the invention. In one embodiment, the instructional material may be part of a kit useful for generating a polymer system of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of a formulation of the compositions.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Compositions of the Invention

The invention includes a light-sensitive material comprising a reversibly crosslinked polymer network. The network comprises a plurality of reversible covalent crosslinks. The reversible crosslinks may be reversed by application of heat, vacuum, adjustment of solvent concentration, and combinations thereof. In one embodiment, the compositions of the invention include compositions comprising a diene-containing reactant and a dienophile-containing reactant, wherein the diene-containing reactant and the dienophile-containing reactant may react through a Diels-Alder reaction to form a Diels-Alder adduct.

Figure 5:
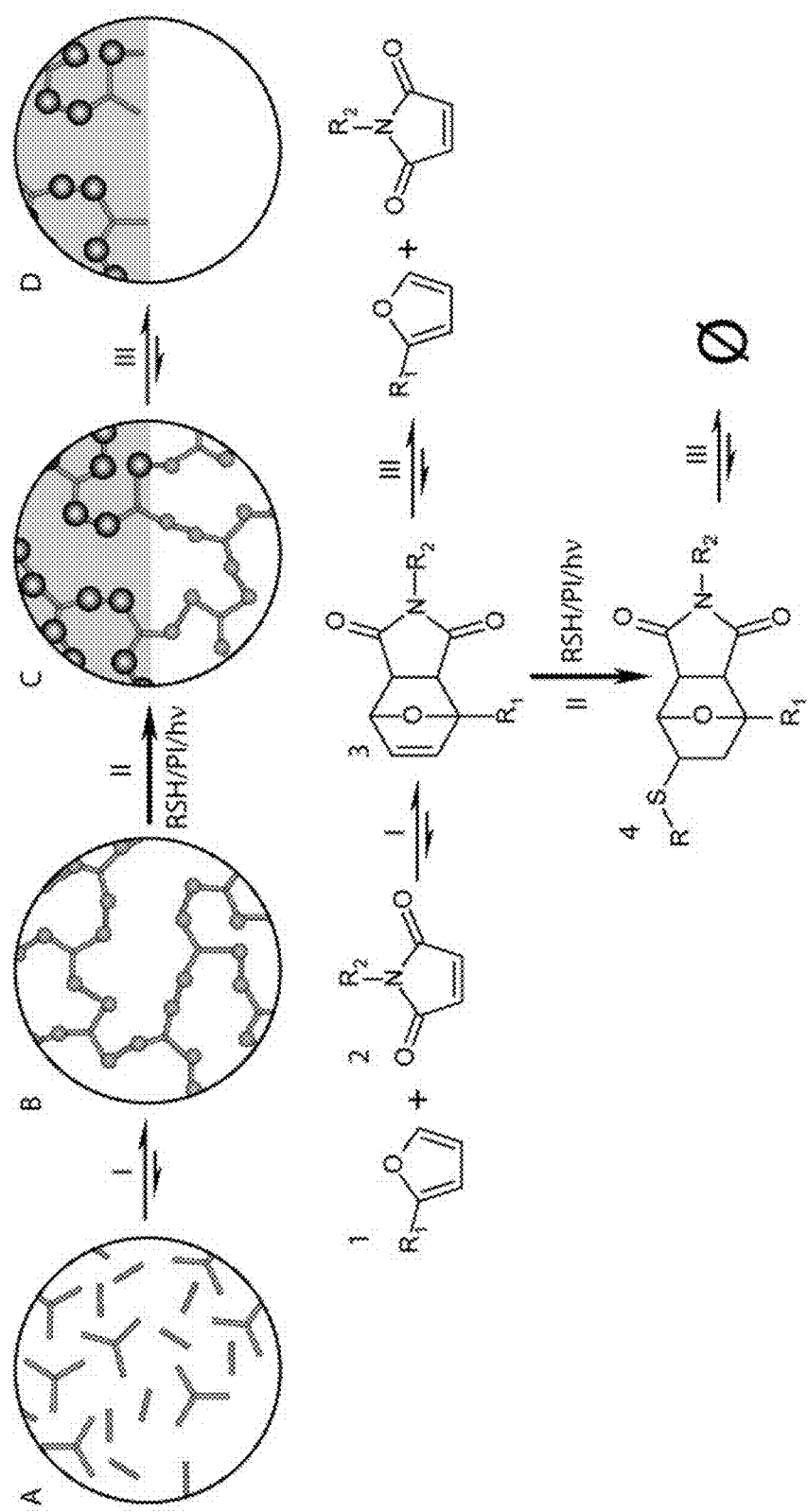
FIG. 5 is a schematic illustration of the photofixation process and associated chemical reactions. First, multi-functional furan (1) and maleimide (2) monomers (bubble A) form a crosslinked polymer (bubble B) by the Diels-Alder reaction (reaction I). In the irradiated areas (bubble C) the resulting oxy-norbornene groups (3) are then selectively converted to irreversible crosslinks (4) by radical reactions with thiol molecules freely suspended in the polymer network (reaction II). The pattern is then developed by selectively removing the remaining material in the non-irradiated areas by shifting chemical equilibrium such that the retro-Diels-Alder reaction (reaction III) occurs and the material depolymerizes (bubble D).

While there are many reversible covalent chemical reactions (Engle & Wagener, 1993, J. Macromol. Sci. R. M C. C33 (3):239-257; Kloxin et al., 2010, Macromol. 43 (6):2643-2653), few are as robust or possess the unique behavior of the Diels-Alder reaction between furan (1) and maleimide (2) (FIG. 5). Upon heating, the Diels-Alder adduct (3) readily undergoes a retro-Diels-Alder reaction to recover (1) and (2). Polymer networks formed by the Diels-Alder reaction are reversibly depolymerized by increasing the temperature; however, side-reactions can render the Diels-Alder adduct irreversible. By intentionally and spatio-selectively triggering a side-reaction, the location of this adduct within the scaffold is permanently fixed. The oxy-norbornene adduct (3) exhibits excellent reactivity within the thiol-ene and other radical-mediated reactions. By introducing a photoinitiator and a thiol-functionalized species into the composition, the Diels-Alder scaffold is readily photofixed upon irradiation via the thiol-ene reaction. The material in the unexposed region remains unreacted and may be easily removed with sample heating, leaving the irreversibly-crosslinked user-defined structure. FIG. 5 illustrates this negative tone photofixation process and the accompanying chemical reactions.

In one embodiment, the reversible covalent crosslinks comprise Diels-Alder adducts including a carbon-carbon double bond. In another embodiment, the material further comprises a plurality of fixing molecules, such as a thiol molecule. The fixing molecule may react with at least a fraction of the carbon-carbon double bond of the Diels-Alder adducts, thus preventing a retro Diels-Alder reaction. Optionally, the material may further comprise a plurality of photoinitiator molecules (other than the fixing molecules) distributed in the light sensitive material.

In an embodiment, the light-sensitive material is prepared via polymerization of a mixture including a diene-containing reactant, a dienophile-containing reactant, a fixing molecule and an optional photoinitiator. In another embodiment, the light-sensitive material may be formed by preparing a mixture of a first component comprising a diene-containing reactant, a second component comprising a dienophile-containing reactant, a third component comprising a fixing molecule, and an optional plurality of photoinitiator molecules. The first component may comprise a plurality of diene-containing reactants. The second component may comprise a plurality of dienophile-containing reactants. The third component may comprise a plurality of fixing molecules. The fixing molecule may be a thiol molecule or monomer. Each component may further comprise one or more additive components such as shelf-stabilizing additives. In an embodiment, the amount of such non-reactant component in each of the first, second, or third component is less than 1%. A solvent may also be included in the mixture. Useful solvents include but are not limited to water, dichloromethane, dimethyl sulfoxide, dimethylformamide, tripropylene glycol, triethylene glycol, and diethylene glycol. In an embodiment, the wt % of solvent is 10-20 wt % solids.

In one embodiment, polymerization occurs through Diels-Alder polymerization of diene and dienophile groups included in the diene-containing and dienophile-containing reactants, the reactants being selected so as to form a polymer network at sufficiently high conversion. If necessary, reaction conditions during Diels-Alder polymerization may be controlled to minimize reaction between the thiol molecules and the dienophile monomers.

In one aspect, the reversibly crosslinked polymer network may be formed using distinct reactions. In one embodiment, the network is formed through Diels-Alder reaction between multifunctional diene- and dienophile-containing reactants. In another embodiment, the reactants used to form the network may contain polymerizable groups other than dienes or dienophiles. A non-limiting example of such a monomer is a furan and maleimide adduct that has two methacrylate groups attached (Heath et al., 2008, Macromol. 41:719-726). The adduct is incorporated into the network by copolymerization with methyl methacrylate. Alternatively, adducts may also be functionalized with epoxy groups and form a gel by reaction with multifunctional amines (McElhanon et al., 2002, J. Appl. Polym. Sci. 85 (7):1496). In either case, the resulting crosslinks of the network contain the reversible Diels-Alder adduct while the actual polymerization is accomplished by another mechanism. In yet another embodiment, the diene-containing and dienophile-containing reactants may contain additional polymerizable groups and may be polymerized by a mechanism other than a radical mechanism (e.g. a condensation polymerization or a ring-opening polymerization).

In one embodiment, the diene-containing reactant and dienophile-containing reactant are selected so that they may react and produce a Diels-Alder adduct containing an electron-rich vinyl group, which may participate in the subsequent photofixation reaction. In another embodiment, the photofixation reaction is a thiol-ene reaction. In yet another embodiment, the adduct formed is a norbornene-type adduct. In yet another embodiment, the norbornene-type adduct is norbornene itself or a norbornene derivative. In yet another embodiment, the norbornene-type adduct is oxy-norbornene or an oxy-norbornene derivative. In yet another embodiment, the adduct is formed by reacting maleimide or a functionalized maleimide with furan or a functionalized furan (Scheme 1).

Scheme 1

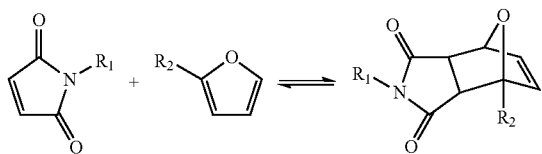

In one embodiment, the diene-containing reactant comprises a cyclic diene. In another embodiment, the diene-containing reactant comprises a five-membered ring cyclic diene. Five-membered cyclic dienes include, but are not limited to, furan, cyclopentadiene, fulvene and derivatives thereof. In another embodiment, the diene-containing reactant comprises an open chain diene, such as a cis-1,3-butadiene-type monomer.

In an embodiment, the dienophile-containing reactant comprises a substituted or non-substituted cyclic alkene. The dienophile-containing reactant may include a five membered ring cyclic dienophile. Suitable cyclic dienophiles include, but are not limited to, maleimide and derivatives thereof A non-limiting illustrative example of a non-cyclic dienophile is cyanoolefins (Boul et al., 2005, Org. Lett. 7 (1):15).

In one embodiment, the diene/dienophile-containing reactant pair is furan/maleimide. Other exemplary diene/dienophile-containing reactant pairs include, but are not limited to: cyclopentadiene (which may react as diene and/or dienophile) (Takeshita et al., 1971, U.S. Pat. No. 3,826,760; Kennedy & Castner, 1979, J. Polym. Sci. Part A—Polym. Chem. 17(7):2055-2070; Stevens & Jenkins, 1979, J. Polym. Sci. Part A—Polym. Chem. 17(11):3675-3685; Salamone et al., 1988, J. Polym. Sci. Part A—Polym. Chem. 26(11):2923-2939; Chen & Ruckenstein, 1999, J. Polym. Sci. Part A—Polym. Chem. 37(23):4390-4401; Grigoras et al., 2008, J. Appl. Polym. Sci. 107(2):846-853); maleimide and anthracene (Jones et al., 1999, Macromol. 32(18):5786-5792; Grigoras et al., 2008, J. Appl. Polym. Sci. 107(2):846-853); cyanoethylenes and anthracene (Reutenauer et al., 2009, Eur. J. Org. Chem. 11:1691-1697); and cyanoethylenes and fulvenes (Boul et al., 2005, Org. Lett. 7(1):15-18). The reactivity of the particular diene and dienophile pairs influences the equilibrium monomer conversion at a given temperature.

In an embodiment, the diene-containing reactant comprises a furan group, the dienophile-containing reactant comprises a maleimide group, and the reversible covalent bonds are formed between the furan moieties and the maleimide moieties. In another embodiment, the diene-containing reactant comprises from about 3 to about 6 furan groups. The furan groups preferably do not include any substitution groups that might interfere with the Diels-Alder reaction. The furan molecule may have a molecular weight from 134 amu to 1,000 amu, from 134 amu to 10,000 amu; or greater than 10,000 amu. In another embodiment, the dienophile-containing reactant comprises from about 2 to about 6 maleimide groups. The maleimide molecule may have a molecular weight from 134 amu to 500 amu, from 134 amu to 1,000 amu, from 134 amu to 10,000 amu; or greater than 10,000 amu. The maleimide groups preferably do not include any substitution groups that might interfere with the Diels-Alder reaction.

In one embodiment, the retro Diels-Alder reaction that imparts thermal reversibility to a crosslink is stopped by the irreversible reaction of the ene group of the Diels-Alder adduct with a fixing molecule. The fixing molecule may be a thiol molecule or another molecule reactive with Diels-Alder adducts. The bottom reaction in FIG. 1 is a non-limiting illustration of a thiol photofixing reaction. Light exposure generates radicals through cleavage of a photoinitiator (P.I.), which subsequently reacts with the thiol to produce thiyl radicals, which irreversibly add to the ene group of the Diels-Alder adduct, thus preventing the retro Diels-Alder reaction.

In one embodiment, the light-sensitive materials of the invention incorporate thiol molecules as fixing molecules. In different embodiments, the thiol molecule or monomer may be a monofunctional monomer including one thiol group or a multifunctional monomer including a plurality of thiol groups. In an embodiment, thiol molecules are not bound to the polymer network prior to irradiation and are able to diffuse to nearby Diels-Alder adducts during photofixation. Since the thiol-ene reaction is fairly robust, there is a wide range of thiol choices. In an embodiment, the thiol is an alkyl 3-mercaptopropionate. The thiol molecule may be pentaerythritol tetrakis-3-mercaptopropionate (PETMP, MW=489 amu).

Non-limiting examples of thiol fixing molecules include 1-dodecane thiol, 3-butyl mercaptopropionoate, 3-butyl thioglycolate, thiophenol and combinations thereof. The photofixation processes of the invention may be influenced by the distribution of the fixing molecule-reactive ene groups within the polymer network; this network can be viewed as a "scaffold" for the reactive groups. The network scaffold may greatly reduce many of the deleterious transport effects of conventional photopolymerization in liquid monomer, while maintaining the advantages of high conversion and rapid reaction kinetics. In a mechanism such as a thiol-ene mechanism, a single initiation event instigates a cascade of propagation and chain transfer reactions. These propagation and chain transfer reactions occur on the polymer network scaffold, allowing control of many of the reaction-diffusion characteristics of conventional photopolymerization. For example, the fixing molecule-reactive network scaffold may reduce monomer diffusion that occurs during photopolymerization (owing to the newly formed concentration gradient), and virtually eliminate thermally driven transport effects resulting from the heat of polymerization. In a non-limiting embodiment, sedimentation effects typically found when liquid monomers are photopolymerized, forming polymer of different density, are not found in the photofixation processes of the present invention.

In one embodiment, a certain degree of diene- and/or dienophile-containing reactant and thiol may be acceptable. In this case, excess thiol may be used in the formulation to ensure that enough thiol remains after the network formation to do the subsequent radical-mediated thiol addition across the Diels-Alder adduct. In another embodiment, the monomers containing other polymerizable groups may be polymerized by radical mechanism in the presence of thiols; the thiols may be introduced at a later stage of the process (e.g., by subsequently swelling the thiol monomer into the network).

In one aspect, the thiol can potentially undergo the base-catalyzed Michael addition reaction with the maleimide. This reaction is often employed in protein functionalization owing to its ease and high yield. However, in the absence of a nucleophile or base, the thiolate anion is never formed, which effectively prevents the Michael addition from occurring. The addition of a small amount of acid is sufficient to prevent the unwanted thiol-maleimide reaction. In one embodiment, the thiol utilized in these studies (6) may contain trace levels of acid impurities sufficient to retard the thiol-maleimide reaction. In another embodiment, acidic conditions may be used to avoid the Michael addition reaction between thiol fixing molecules and maleimide molecules. In yet another embodiment, the acidity may be controlled by using a first, second, and/or third acidic component. In yet another embodiment, the third (thiol-containing) component is acidic. In yet another embodiment, an acid such as but not limited to hydrochloric or sulfuric acid may be added to the mixture to suppress the side-reaction.

The photoinitiator contemplated within the invention is a molecule that, upon irradiation with a given wavelength at a given intensity for a given period of time, generates at least one species capable of catalyzing, triggering or inducing reaction between the reversibly crosslinked polymer and the fixing molecule. A photoinitiator known in the art may be employed, such as a benzoin ether and a phenone derivative such as benzophenone or diethoxyacetophenone. In one embodiment, the irradiation comprises ultraviolet electromagnetic radiation (wavelength from about 10 nm to about 400 nm), visible electromagnetic radiation (wavelength from about 400 nm to about 750 nm) or infrared electromagnetic radiation (radiation wavelength from about 750 nm to about 300,000 nm). In another embodiment, the electromagnetic radiation comprises ultraviolet or visible electromagnetic radiation.

Ultraviolet or UV light as described herein includes UVA light, which generally has wavelengths between about 320 and about 400 nm, UVB light, which generally has wavelengths between about 290 nm and about 320 nm, and UVC light, which generally has wavelengths between about 200 nm and about 290 nm. UV light may include UVA, UVB, or UVC light alone or in combination with other type of UV light. In one embodiment, the UV light source emits light between about 350 nm and about 400 nm. In some embodiments, the UV light source emits light between about 400 nm and about 500 nm.

Non-limiting examples of the photoinitiator contemplated within the invention are:

1-hydroxy-cyclohexyl-phenyl-ketone (Irgacure™ 184; Ciba, Hawthorne, N.J.);
a 1:1 mixture of 1-hydroxy-cyclohexyl-phenyl-ketone and benzophenone (Irgacure™ 500; Ciba, Hawthorne, N.J.);
2-hydroxy-2-methyl-1-phenyl-1-propanone (Darocur™ 1173; Ciba, Hawthorne, N.J.);
2-hydroxy-1-[4-(2-hydroxyethoxy)phenyl]-2-methyl-1-propanone (Irgacure™ 2959; Ciba, Hawthorne, N.J.);
methyl benzoylformate (Darocur™ MBF; Ciba, Hawthorne, N.J.);
oxy-phenyl-acetic acid 2-[2-oxo-2-phenyl-acetoxy-ethoxy]-ethyl ester;
oxy-phenyl-acetic 2-[2-hydroxy-ethoxy]-ethyl ester;
a mixture of oxy-phenyl-acetic acid 2-[2-oxo-2-phenyl-acetoxy-ethoxy]-ethyl ester and oxy-phenyl-acetic 2-[2-hydroxy-ethoxy]-ethyl ester (Irgacure™ 754; Ciba, Hawthorne, N.J.);
alpha,alpha-dimethoxy-alpha-phenylacetophenone (Irgacure™ 651; Ciba, Hawthorne, N.J.);
2-benzyl-2-(dimethylamino)-1-[4-(4-morpholinyl)-phenyl]-1-butanone (Irgacure™ 369; Ciba, Hawthorne, N.J.);
2-methyl-1-[4-(methylthio)phenyl]-2-(4-morpholinyl)-1-propanone (Irgacure™ 907; Ciba, Hawthorne, N.J.);
a 3:7 mixture of 2-benzyl-2-(dimethylamino)-1-[4-(4-morpholinyl)phenyl]-1-butanone and alpha,alpha-dimethoxy-alpha-phenylacetophenone per weight (Irgacure™ 1300; Ciba, Hawthorne, N.J.);
diphenyl-(2,4,6-trimethylbenzoyl)phosphine oxide (Darocur™ TPO; Ciba, Hawthorne, N.J.);
a 1:1 mixture of diphenyl-(2,4,6-trimethylbenzoyl)-phosphine oxide and 2-hydroxy-2-methyl-1-phenyl-1-propanone (Darocur™ 4265; Ciba, Hawthorne, N.J.);
phenyl bis(2,4,6-trimethyl benzoyl) phosphine oxide, which may be used in pure form (Irgacure™ 819; Ciba, Hawthorne, N.J.) or dispersed in water (45% active, Irgacure™ 819DW; Ciba, Hawthorne, N.J.);
a 2:8 mixture of phosphine oxide, phenyl bis(2,4,6-trimethyl benzoyl) and 2-hydroxy-2-methyl-1-phenyl-1-propanone (Irgacure™ 2022; Ciba, Hawthorne, N.J.); Irgacure™ 2100, which comprises phenyl-bis(2,4,6-trimethylbenzoyl)-phosphine oxide);
bis-(eta 5-2,4-cyclopentadien-1-yl)-bis-[2,6-difluoro-3-(1H-pyrrol-1-yl)phenyl]-titanium (Irgacure™ 784; Ciba, Hawthorne, N.J.);
(4-methylphenyl) [4-(2-methylpropyl)phenyl]-iodonium hexafluorophosphate (Irgacure™ 250; Ciba, Hawthorne, N.J.);
2-(4-methylbenzyl)-2-(dimethylamino)-1-(4-morpholinophenyl)-butan-1-one (Irgacure™ 379; Ciba, Hawthorne, N.J.);
4-(2-hydroxyethoxy)phenyl-(2-hydroxy-2-propyl)ketone (Irgacure™ 2959; Ciba, Hawthorne, N.J.);
bis-(2,6-dimethoxybenzoyl)-2,4,4-trimethylpentylphosphine oxide;
a mixture of bis-(2,6-dimethoxybenzoyl)-2,4,4-trimethylpentylphosphine oxide and 2-hydroxy-2-methyl-1-phenyl-propanone (Irgacure™ 1700; Ciba, Hawthorne, N.J.);
titanium dioxide; and mixtures thereof.

The photoinitator may be used in amounts ranging from about 0.01 to about 25 weight percent (wt %) of the composition, more preferably from about 0.1 to about 20 weight percent (wt %) of the composition, more preferably from about 1 to about 15 weight percent (wt %) of the composition, more preferably from about 2 to about 10 weight percent (wt %) of the composition.

The cross-link density may affect the diffusion of molecular species within the scaffold. The initial crosslink density is determined by selection of the diene- and dienophile-containing reactants. Smaller crosslink density may inhibit diffusion and help control photolithographic feature sizes. Larger crosslink density may be better for removing material trapped within photofixed volumes. Crosslinked polymer networks may be characterized by the gel-point conversion, a critical transition point where there is a single sample spanning macromolecule. The gel-point conversion is defined mathematically as the conversion where the weight average molecular weight diverges. In thermally reversible covalently bound gels, the gel-point conversion depends on the functionality of monomers, and unlike conventional step-growth thermosets, the temperature dependence of the bond. Accordingly, a temperature (the gel-point temperature) exists below which the material is in a solid gel state, and above which it is in a liquid-like or sol state. In an embodiment, the light sensitive materials of the invention are in a solid gel state and are maintained at a temperature below the gel-point temperature prior to and during "photofixing." Photofixation may take place below 60° C., below 90° C., or from 25 to 60° C. Depolymerization may take place at temperatures below 160° C. to limit side reactions that can occur at higher temperatures.

Designing the network involves consideration of several factors. In an embodiment, the conversion of the monomers (p) is greater than the gel-point conversion ($p_g$) when the network is photofixed. For a network formed through Diels-Alder reaction between multifunctional diene and dienophile monomers, the gel point (for furan and maleimide) may be adjusted by varying the average monomer functionality of both the furan and maleimide, and the ratio of furan to maleimide groups. The equilibrium conversion of the Diels-Alder pair depends on the temperature, concentration, and choice of the diene/dieneophile.

The number of functional groups affects The The variable $p_g$ can be calculated using the Flory-Stockmayer equation $(p_g=[r(f_a-1)(f_b-1)]^{1/2})$, where r is the stoichiometric ratio, $f_a$ is the number of functional groups for the diene, and $f_b$ is the number of functional groups for the dienophile. For example, a trifunctional furan and difunctional maleimide mixture that is stoichiometrically balanced (i.e., r=1) yields a $p_g=[(2-1)(3-1)]^{-1/2} \approx 0.71$; thus, in this example, according to this equation p must be greater than 0.71 to be 'photofixed' into a network. In the case of a pair of good Diels-Alder reactants, such as furan and maleimide, monomer functionality may be selected to be minimal so that a high equilibrium conversion is required for gelation to occur. If the monomer functionality is quite high, it can be difficult to drive the Diels-Alder reaction sufficiently towards the reactants (and associated reversible bond cleavage) without the use of an open, non-equilibrium experiment, or high temperatures that lead to irreversible reactions. In an embodiment, the average functionality the monomers used to form the network is greater than 2. The number of functional groups per monomer may be from 2 to 4, from 2 to 6, from 2 to 10, from 2 to 16, or even larger for dendrimers or linear polymers with pendant functional groups. In an embodiment, one of the monomers has an average functionality of 2.

The variable p increases with increasing functional group concentration. The functional group concentration can be changed by solvent (e.g., amount of water in a hydrogel) and/or by the size of the monomers (i.e., molecular weight). Increasing the molecular weight results in a decrease in functional group concentration, which in turn favors the retro-Diels-Alder reaction and depolymerization. As a consequence the gel point temperature is shifted to lower temperatures. Each diene/dienophile pair has different kinetic and thermodynamic properties, where the latter properties determine the maximum conversion (p) that is attainable and is affected by temperature. The quantity p increases with decreasing temperature.

Diffusion of the thiol monomers in the light sensitive material can be affected by the thiol monomer size and structure as well as the initial crosslink density of the network. In addition, as the photofixation process proceeds, a photofixed network structure will evolve and influence diffusion of thiol molecules.

The number of thiol functional groups may be less than, greater than or equal to the number of adducts required to form a network (as defined by $p_g$). In an embodiment, the number of thiol, furan and maleimide groups are equal; this may result in an excess of thiol at the photofixation temperature. If the adduct can homopolymerize to some extent, the photofixation process may still work when the amount of thiol is far less that of furan and maleimide. While monofunctional thiols can be used to photofix an adduct, multifunctional thiol monomers can also be used to increase the crosslink density in the photofixed regions of the network (i.e., by crosslinking adducts together). The thiol monomer may also contain additional non-thiol functional groups; non-thiol functional groups can be a convenient method for providing additional functionality to the network. For example, if a cysteine (an amino acid with a thiol residue) is appended to a peptide, the network can be photofixed with this group effectively labeling the network with the peptide. As another example, the chemical properties of the network may be modified by using carboxylic acid or amine functionalized thiols.

A separate photoinitiator is not required in the light-sensitive material if the photofixation system is capable of undergoing initiatorless, phototriggered photopolymerization (e.g. the system undergoes initiatorless photopolymerization under irradiation with UV radiation as can occur in the thiol-ene system). In an embodiment, a photoinitiator other than the fixing molecule is included in the light sensitive material. In another embodiment, the initiator is a radical photoinitiator. The photoinitiator may be activated by visible or UV light and may be a type-I or type-II initiator. In yet another embodiment, the photoinitiator is a type-I cleavage type initiator such as such as DMPA (UV activated) or BAPO (activated by visible light). In yet another embodiment, the photoinitiator is a type-II abstraction type from a family such as the benzophenones, thioanthones, quinines, and benzyl. A coinitiator, such as an amine, may or may not be added. For the thiol-ene system, the photoinitiator concentration can be quite low as the thiol-ene reaction is very efficient. In an embodiment, the concentration of the initiator is from 0.1 to 3 wt %. The light exposure time may be from 5 to 15 minutes.

In an embodiment, a film of the light sensitive material may be formed by mixing the diene-containing reactant, dienophile-containing reactant and fixing molecules or monomers in a solvent with the optional initiator, casting the monomers/photoinitiator solution into a film and then evaporating the remaining solvent. In another embodiment, a casting solvent is not required. Methods for forming polymer films from monomer solutions are known to the art, and include, but are not limited to spin casting, dip coating, and spray coating. The solvent may help evenly distribute the monomers, as well as provide a handle to control the viscosity for casting. In principle, as long as the monomers are soluble together and the Diels-Alder network-forming reaction is slow enough so that the material can be cast before it sets, a solvent is not needed.

In one aspect, photofixation can occur via reaction between reactive "ene" groups present in the polymer network and thiol molecules present in the light sensitive material. The thiol-ene reaction can proceed via a step growth addition mechanism that comprises the addition of a thiyl radical through a vinyl functional group and subsequent chain transfer to a thiol, regenerating a thiyl radical (Jacobine, "Radiation Curing in Polymer Science and Technology III, Polymerisation Mechanisms"; Fouassier & Rabek, Eds.; Elsevier Applied Science, London, 1993; Hoyle et al., 2004, J. Polym. Sci. Part A—Polym. Chem. 42:5301-5338; Cramer & Bowman, 2001, J. Polym. Sci. Part A—Polym. Chem. 39 (19):3311; Cramer et al., 2003, Macromol. 36 (12):4631; Cramer et al., Macromol. 2003, 36 (21):7964; Reddy et al., 2006, Macromol. 39(10):3673). The process can be initiated by photogenerated thiyl radicals. The thiyl radicals may be generated through direct photoexcitation of the thiol followed by lysis of the sulfur-hydrogen bond, reaction of the thiol with a radical formed by excitation of a non-thiol photoinitiator molecule, or through hydrogen abstraction from the thiol by an excited photoinitiator. In an embodiment, exposure of the light sensitive material to light under conditions sufficient to induce reaction between "ene" groups in the Diels-Alder adducts and thiol molecules involves the steps of photogeneration of thiyl radicals and reaction of thiyl radicals with the "ene" groups. At a later stage of the process some thiyl radicals may be photogenerated and some may result from chain transfer/hydrogen abstraction from carbon-centered radicals.

Conventional chemically amplified photoresists consist of photoacid generators that alter the solubility of the resist in the exposed area. Diffusion of the generated acid affects the resolution of the pattern (Levinson, "Principles of Lithography", $2^{nd}$ ed., SPIE, Washington, 2005). In the highly crosslinked material described herein, diffusion of radicals is expected to be greatly limited. As such, this approach can produce improved resolution over conventional materials. However, while micron sized features can be easily produced with simple masks produced by inkjet printers as demonstrated herein, nanometer sized features are typically produced with more complicated optical techniques. In an embodiment where simple mask production techniques are used, the resolution of the patterning technique may be at least 25 μmeters.

Methods of the Invention

The invention includes a method for photofixing a light sensitive material. The method comprises the step of providing a light sensitive material comprising at least one reversibly crosslinked polymer and at least one fixing molecule, wherein the polymer comprises at least one reversible covalent crosslink, wherein the crosslink comprises a Diels-Alder adduct, wherein the adduct is formed by a reaction between a diene-containing reactant and a dienophile-containing reactant, wherein the material optionally comprises at least one photoinitiator. The method further comprises the step of exposing a section of the material to electromagnetic radiation for a given time and at given intensity as to induce a reaction between the adduct and the fixing molecule, wherein the reaction causes a covalent modification of the adduct which prevents the crosslink from undergoing the reverse Diels Alder reaction, whereby the section of the light sensitive material is photofixed.

The invention also includes a method of patterning an article, wherein the article comprises a light sensitive material. The method comprises the step of providing a light sensitive material comprising at least one reversibly crosslinked polymer and at least one fixing molecule, wherein the polymer comprises at least one reversible covalent crosslink, wherein the crosslink comprises a Diels-Alder adduct, wherein the adduct is formed by a reaction between a diene-containing reactant and a dienophile-containing reactant, wherein the composition optionally comprises at least one photoinitiator. The method further comprises the step of exposing a section of the material to electromagnetic radiation for a given time and at given intensity as to induce a reaction between the adduct and the fixing molecule, wherein the reaction causes a covalent modification of the adduct which prevents the crosslink from undergoing the reverse Diels Alder reaction, whereby the section of the material is photofixed. The method further comprises the step of submitting the material to a depolymerization process which induces the material that is not photofixed to undergo a reverse Diels Alder reaction, thereby generating depolymerized material. The method further comprises the step of removing the depolymerized material from the article, thereby generating pattern features in the article.

Selective photofixation of network crosslinks may allow later removal of unexposed sections of the network through thermal and/or solvent-induced depolymerization of the Diels-Alder adduct network. In this embodiment, reversal of the non-photofixed crosslinks can produce breakdown of the unexposed sections of the network. In a non-limiting example, the material may be treated by heating the material, contacting the material with suitable solvent, or a combination thereof. In an embodiment, images may be developed by immersing in alcohol (e.g. furfuryl alcohol) at temperatures from 25 to 90° C.

In an embodiment, the invention includes a method for photolithography or 2D/3D prototyping, which involves the step of selectively photofixating a section of the network, followed by the step of thermally depolymerizing the material, thus remove the remainder of the network. FIG. 2 (as illustrated by I-III) and FIG. 9 provide non-limiting schematic illustrations of 3D prototyping through selective photofixation of sections of a light-sensitive material. The invention also envisions any known physical or chemical method that allows for the introduction of a 2D/3D image into a layer or block of the network. In a non-limiting embodiment, the invention includes utilizing a mask or projecting a 2D or 3D image onto a block as to introduce the 2D/3D image onto a layer or block of the network. In another non-limiting embodiment, the invention includes providing a section of the network, performing selective photofixation of the section to generate a first 2D/3D structure, contacting the first structure with a new construct of the reversible polymer network scaffold as to generate a second 2D/3D network structure, and performing selective photofixation of the new 2D/3D structure. The last two steps may be optionally repeated as many times as necessary as to arrive at the desired 2D/3D network structure.

Photofixation lithography in a reversible polymer network scaffold represents a powerful new approach to fabricate arbitrarily complex 3D structures. The use of a reversibly crosslinked polymer network as a photoresist has a number of potential advantages. It is expected that diffusion of the active species in such systems will be significantly retarded by the polymer network, enhancing the feature resolution. Furthermore, thin films may be prepared without the use of volatile organic solvents, because the starting materials are low viscosity monomers, rather than linear polymers that are employed in conventional photoresists (i.e., SU-8 popularized by soft-lithography). Moreover, it is also possible that the use of solvents could be eliminated in the image development step as well. Photofixation provides a method to eliminate thermoreversible behavior within reversible adhesives, self-healing materials, non-linear optics, and polymer encapsulants. Finally, the utilization of photofixation lithography in conjunction with thiol-functionalized materials, such as cysteine-terminated peptides, thiol functionalized nanoparticles, and thiol-functionalized sensing moieties, would enable the simultaneous fabrication of complex 3D structures with uniquely defined chemical functionalization for an array of applications.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination.

Although the description herein contains many embodiments, these should not be construed as limiting the scope of the invention but as merely providing illustrations of some of the presently preferred embodiments of the invention.

All references throughout this application (for example, patent documents including issued or granted patents or equivalents; patent application publications; and non-patent literature documents or other source material) are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

It is to be understood that wherever values and ranges are provided herein, all values and ranges encompassed by these values and ranges, are meant to be encompassed within the scope of the present invention. Moreover, all values that fall within these ranges, as well as the upper or lower limits of a range of values, are also contemplated by the present application.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Materials

All materials were used without further preparation unless indicated otherwise below.

Synthesis of 2,2-bis(((3-furan-2-yl-methyl)thio)propanoyl)oxy)methyl)propane-1,3-diyl bis(3-((furan-2-ylmethyl)thio)propanoate (5)

20.0 g of SR295 (Sartomer) was combined with 23.9 g of freshly distilled furfuryl mercaptan in approximately 250 ml of dichloromethane to reduce the mixtures viscosity. A catalytic amount of triethylamine (3 to 4 drops) was then added and the reaction was allowed to proceed overnight. Reduction under vacuum gave the product with complete functionalization of acrylate moieties (multiplets at 6.42, 6.12, and 5.90 ppm) and elimination of the thiol peak (1.92 ppm). Further heating under vacuum was necessary to reduce the thiol odor.

Synthesis of exo-7-Oxabicyclo[2.2.1]hept-5-ene-2,3-dicarboxylic anhydride (precursor to 8)

Furan (65.6 g, Sigma-Aldrich) was first purified by distillation, and then combined with maleic anhydride (89.6 g, FLUKA). The maleic anhydride was then dissolved in 90 ml of anhydrous THF. After approximately 4 hours a white precipitate formed. The reaction was allowed to continue overnight. The supernatant liquid was removed, and the remaining material was dried in vacuo and used without further preparation.

Synthesis of 1,13-Bismaleimido-4,7,10-trioxamidecane (8)

This procedure was adapted from McElhanon et al., 2002, J. Appl. Polym. Sci. 85 (7):1496-1502. THF was dried using sodium and benzophenone under reflux. All other compounds were extensively dried under vacuum. 19.0 g of exo-7-oxabicyclo[2.2.1]hept-5-ene-2,3-dicarboxylic anhydride were added to 450 ml of dry THF under nitrogen. To this solution, 12.0 g of 4,7,19-trioxa-1,13-tridecanediamine (Fluka) dissolved in 100 ml of THF were added dropwise. After 1 hour a cloudy system formed. ZnBr (25.8 g, Fluka) was added under nitrogen, followed by the dropwise addition of hexamethyldisilizane (28 g, Sigma-Aldrich). After the complete addition of the hexamethyldisilizane all of the material in the flask dissolved. A white precipitate then formed after approximately 1 hour.

The reaction mixture was then washed three times with 150 ml of 0.5 M HCl. The aqueous layer was then extracted with three washes of diethyl ether. The combined organic extracts were then washed with saturated sodium bicarbonate, and reduced under vacuum at 120° C. for 4 hours. After extraction, the crude produce was purified using a silica gel column (100% ethyl acetate) to yield a white solid (62% yield). $^1$H NMR (CDCl$_3$): δ 1.87 (4H, p), 3.47 (4H, t), 3.54-3.64 (m, 12), 6.69 (4H, s).

Fourier Transform Infrared (FTIR) Spectroscopy

Spectroscopic studies were performed with a Nicolet Magna 750 series II Fourier-transform infrared (FTIR) spectrometer equipped with a MCT detector and a horizontal temperature-controlled stage (accurate to 0.1° C.). Samples for IR spectroscopy were produced by casting a thin film of the reactants in dichloromethane onto a NaCl crystal and rapidly evaporating the solvent under vacuum. In a typically run, less than three minutes elapsed between mixing and the initial spectra collection. Reaction during the sample preparation was assumed negligible as the Diels-Alder reaction between furan and maleimide proceeds slowly at ambient temperature. The number of scans per spectrum (between 16 and 512) was adjusted based on the reaction rate. Conversion of the furan and maleimide functionalities was evaluated by monitoring the evolution of the furan peak area, centered at 1010 cm$^{-1}$, and the maleimide peak area, centered at 690 cm$^{-1}$ (Decker et al., 2004, Polym. 45 (17):5803-5811; Tarducci et al., 2005, Chem. Commun 3:406-408). Equilibrium was reached at approximately 4 hours.

The samples were irradiated by an EXFO Acticure high pressure mercury vapor short arc lamp equipped with a 365 nm bandgap filter. Light intensities were measured using an International Light IL1400A radiometer equipped with a GaAsP detector and a quartz diffuser.

Dynamic Mechanical Analysis

Polymer samples were prepared as described elsewhere, only using 1-hydroxy-cyclohexyl-phenyl-ketone (Irgacure 184, Ciba) to enable preparation of optically thin samples. Irradiated samples were cured for 1000 s using the sample conditions as for the FTIR samples.

2D Patterning

Quartz slides were first functionalized with (3-mercaptopropyl)-trimethoxysilane using standard techniques (Walba et al., Liquid Crystals, 31(4):481-489). Slides were spin coated using a Speedline Technologies Model P6700 at an initial speed of 500 rpm for 10 seconds and then a final speed of 4000 rpm for 30 seconds (ramp times were 20 seconds for all steps). Thin films were prepared by adding a 50 wt % dichloromethane containing 0.5% TWEEN 20 (Sigma-Aldrich). Films cast by the latter methods were on the order of 2 microns in thickness while those produced from neat material were 20 microns thick. In both cases, slides were baked at 80° C. for 8 hours after coating.

2-Photon Lithography 3D patterning was obtained via two-photon techniques, where the regions of interest (x-y control) within the gel were selectively exposed to pulsed laser light (1=740 nm, power=670 mW/mm$^2$, scan speed=1.27 msec/mm$^2$) at 1 mm z-plane increments on a 710 LSM NLO confocal microscope stage (Carl Zeiss) equipped with a 20x/0.8 Plan-Apochromat objective (NA=1.0, Carl Zeiss).

Example 1

Polymer Synthesis

A stoichiometric mixture of furan, maleimide, and thiol was prepared using 5, 6, and 7, to which was added 1% weight 8. A slight amount of heat or solvent (dichloromethane) was necessary to melt 6. Bulk solid samples were prepared by heating the material at 80° C. for 4 to 12 hours.

Slides were spin coated using a Speedline Technologies Model P6700 at an initial speed of 1,000 rpm for 10 seconds and then a final speed of 4,000 rpm for 30 seconds (ramp times were 20 seconds for all steps). Thin films were prepared by adding a 10 wt % equivalent of PEG 100 K (Sigma-Aldrich), and a 50 wt % equivalent of a solution of 0.5% TWEEN 20 (Sigma-Aldrich) in toluene (Sigma-Aldrich). Films cast by the latter methods were on the order of 10 microns in thickness, while those produced by the later were less than 1 micron thick. In both cases, slides were baked at 80° C. for 8 hours after coating.

The gels were exposed for 200 seconds in an OAI Hybraalign series 200 Mask Alignment system using a Photronics chrome mask. The light intensity of the i-line was approximately 9 mW/cm$^2$. After exposure, the gels were immediately immersed in furfuryl alcohol (70° C.) to develop the image.

Example 2

A mixture comprising 48.7% wt/wt of a trisfuran(pentaerythritol propoxylate tris(3-(furfurylthiol)propionate, Adzima, et al., 2008, Macromol. 41 (23):9112), 29.9% wt/wt of a bismaleimide(1,1'-(methylene-di-4,1-phenylene)bismaleimide, Sigma Aldrich), 20.4% wt/wt of a tetrathiol(pentaerythritol tetrakis (3-mercaptopropionate), PETMP, Evans Cosmetics), and 1.0% wt/wt of a photoinitiator (1184, Ciba) was prepared. No solvent was used.

Figure 3A:
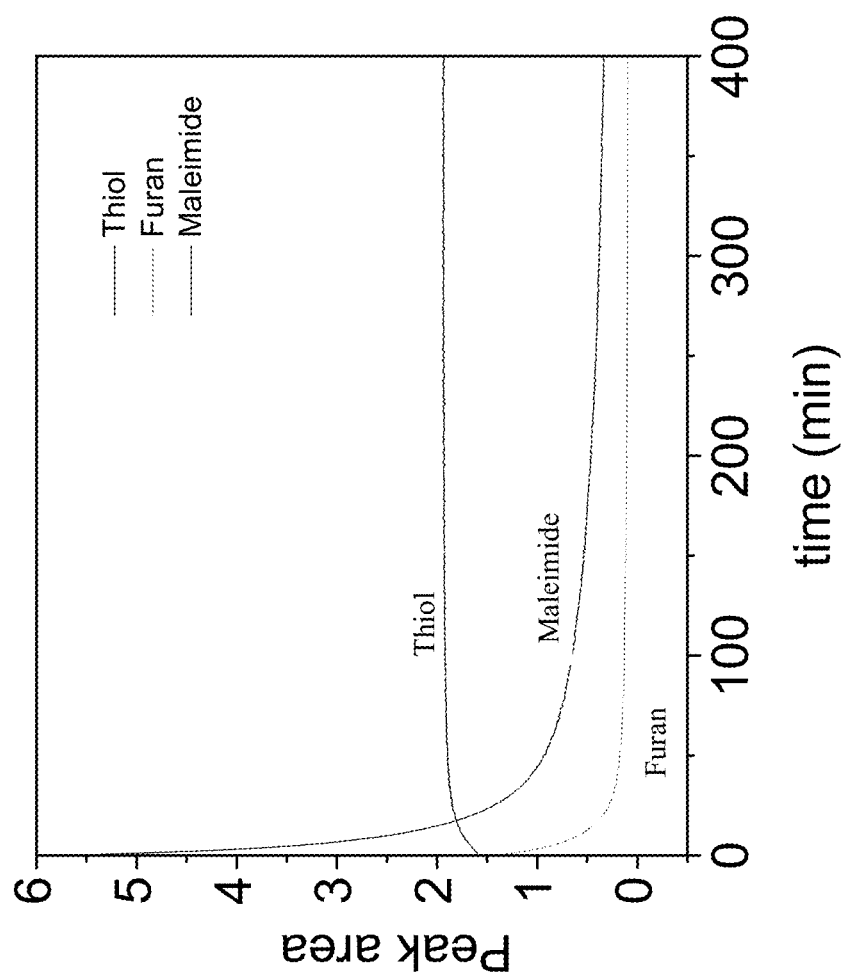
FIGS. 3A-3B, is a set of graphs illustrating reaction kinetics between trisfuran, bismaleimide and tetrakisthiol monomers in the presence of a photoinitiator, as measured using Fourier transform infrared spectroscopy.
Figure 3B:
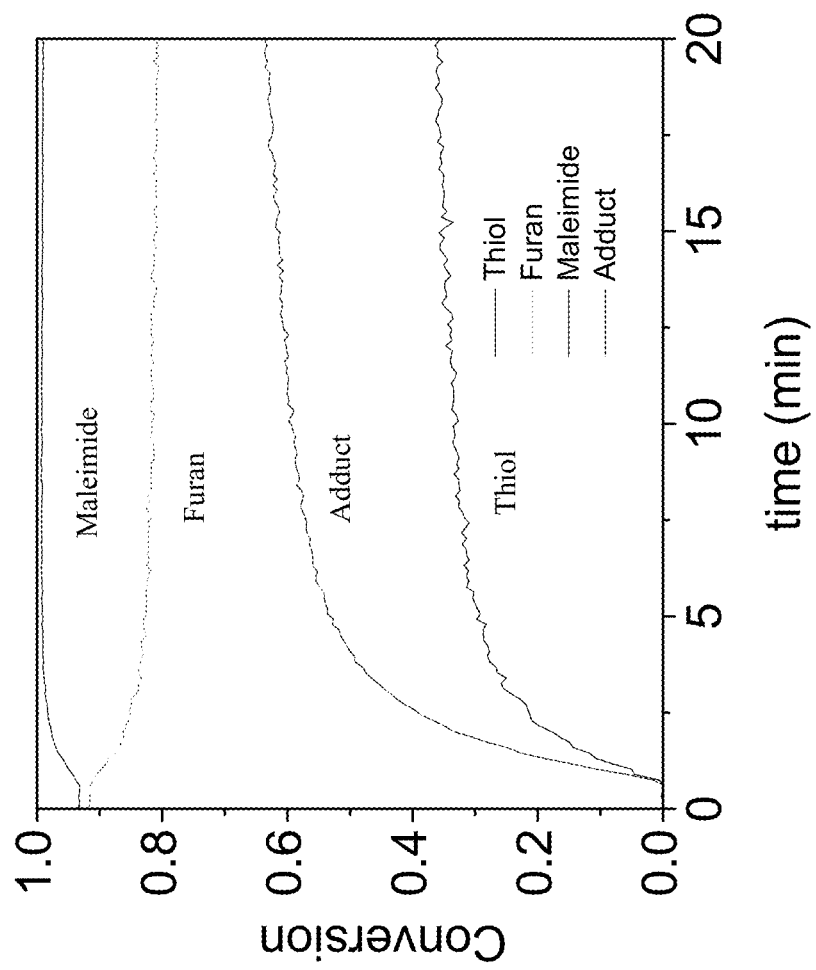

FIGS. 3A-3B illustrate the reaction kinetics between the trisfuran, bismaleimide, and tetrakisthiol monomer in the presence of the photoinitiator, as measured using Fourier Transform infrared spectroscopy. The data illustrated in FIG. 3A corresponds to the initial mixing of the monomers, demonstrating that a network was formed via the Diels-Alder cycloaddition between furan and maleimide while the thiol concentration is unchanged. The slight increase observed in thiol concentration was due to a base line shift. The data illustrated in FIG. 3B corresponds to the material being irradiated (beginning at 1 min) with 365 nm light (9.5 mW/cm$^2$), which initiated the thiol-ene reaction (indicated by the decrease in both thiol and adduct concentration). The increase in furan and decrease in maleimide indicated that the reaction resulted in residual maleimide, producing a stoichiometric imbalance between furan and maleimide and shifting the Diels-Alder reaction toward the reactants.

Example 3

A film of trisfuran, bismaleimide, tetrakisthiol monomers and a photoinitiator was spincasted, and the spincasting solvent was further evaporated. The film was then UV irradiated through a mask (with 9.5 mW/cm$^2$, 365 nm light, 1,000 seconds). The mask features were 100 micrometer lines separated by 400, 300, 200, 100, 50 and 25 micrometer spaces. The film was then immersed in room temperature furfuryl alcohol for 10 minutes to develop the negative of the mask (FIG. 4). The micrograph demonstrated the capability of photofixation to fabricate structures.

Example 4

Infrared spectroscopy revealed that when a stoichiometric mixture of (5), (6), (7), and (8) was equilibrated at 80° C., 86% furan and 88% maleimide are consumed via the Diels-Alder reaction, while less than 1% of the thiol was reacted (FIG. 7A). Consequently, bulk samples and films as thin as 10 μm were readily prepared by mixing the components, spin coating a substrate, and then baking the sample. Thinner films may require the use of a solvent to reduce the viscosity. As the thiol-ene reaction is often considered part of the 'click' chemistry family of reactions, the chemical details of the thiol-bearing species are of minor importance, and this approach could be also be used to incorporate additional chemical functionality within the polymer network with spatial control of its addition.

Upon actinic irradiation, photolysis of the photoinitiator produces radicals that are capable of initiating a variety of reactions. The strained nature of the olefinic bond in the oxy-norbornene makes it a preferable ene for the radical-mediated thiol-ene addition, while the electrically activated maleimide is less reactive towards the thiol-ene reaction and has a greater tendency to homopolymerize Infrared spectroscopy reveals the complete consumption of the free maleimide and oxy-norbornene groups, accompanied by 70% conversion of the thiol (FIG. 7A). This result indicated that the thiol-ene reaction dominates over homo- and co-polymerization of the oxy-norbornene and maleimide. Further, the complete reaction of the maleimide and oxy-norbornene suggested that no reversible bonds remain after irradiation. The network was permanently crosslinked and incapable of reverting to a monomeric liquid state (FIG. 7A).

The multifunctional nature of the thiol (7) results in a large increase in the crosslinking density (FIG. 7B). Applying rubber elasticity theory, $$G \propto \nu T$$

the elastic modulus (G) is proportional to the temperature (T) and crosslinking density ($\nu$). The ratio of the storage modulus at 75° C., before and after irradiation showed that the crosslinking density increased more than fourfold during photofixation. The photofixation reaction was also accompanied by a modest increase in the glass transition temperature, which rose from 16° C. to 43° C. Before photofixation, the glass transition temperature was approximately 60° C. below the curing temperature. This indicated that thermodynamic equilibrium, rather than kinetic frustration via vitrification, limits the Diels-Alder reaction from obtaining near-quantitative conversion. After photofixation, the breadth of the glass transition temperature did not increase, supporting the hypothesis that the primary mode of polymerization is via the step-growth thiol-ene reaction, whereas chain growth mechanisms tend to produce a more heterogeneous network structure and therefore would be expected to broaden the glass transition.

Example 5

Figure 8:
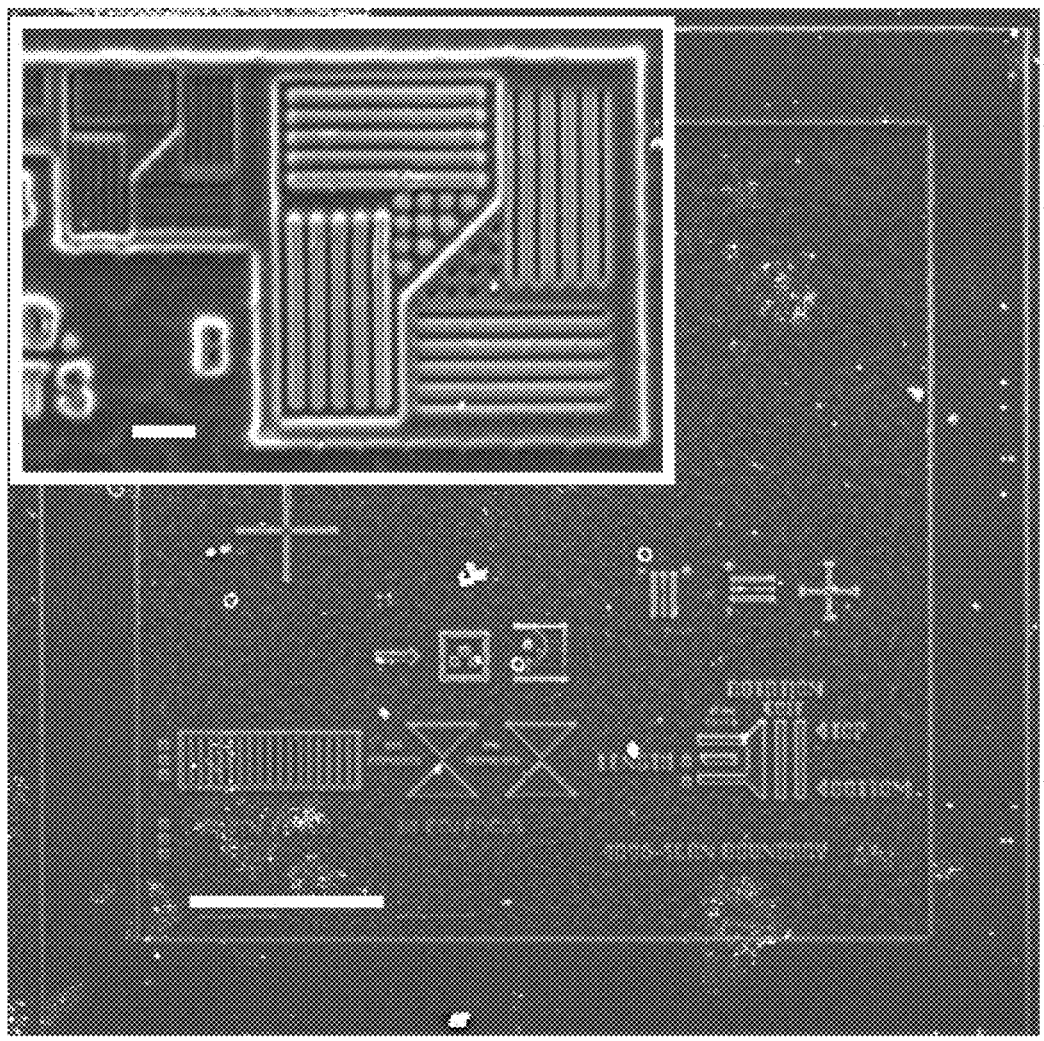
FIG. 8 illustrates two dimensional patterning. An SEM micrograph illustrates features as small as 2 µm that were readily produced in both thin films (<1 µm) and were stripped completely to the glass, and in thicker films (approximately 10 µm) where the etching proceeds 1-2 µm into the film (scale bars 200 µm main image, 20 µm inset).

Selective irradiation of the material using masked light and subsequent heating resulted in the development of an image in only the illuminated regions. Image development is considerably aided by heating the material for 25 minutes at 95° C. in the presence of furfuryl alcohol. Furfuryl alcohol is a naturally derived, high boiling point solvent that additionally traps free maleimide and prevents crosslink reformation. Using a simple photolithographic set up (i.e., collimated light from a medium pressure mercury lamp through a chrome mask), features as small as 2 μm were readily fabricated on thiol functionalized glass surfaces (FIG. 8).

Example 6

Direct writing of 3D patterns into the bulk material presented two additional challenges. First, light must be transmitted deep into the material to initiate radical generation. Second, out-of-focus light must be minimized to prevent unconfined reactions away from the focal plane. While researchers have demonstrated a number of techniques to reduce out of focus reactions, both problems are diminished by utilizing two-photon optical direct write lithography. Two-photon absorptions typically occur at longer wavelengths, where single-photon absorption, with its associated photochemical reactions, is reduced. This enables deeper penetration of light into the sample and minimizes out-of-focus reactions from single-photon processes. Additionally, as two-photon absorption is proportional to the square of the light intensity, rather than directly proportional, two-photon initiation is more readily confined to the focal plane.

The material formulation is the same for both 2D and 3D lithography, as the UV photoinitiator (8) possesses an adequate 2-photon cross-section. Irradiation with a 740 nm femtosecond pulsed laser produced a refractive index change within the sample, allowing immediate visualization of written shapes (FIG. 9A), prior to any heating and image development. After heating the sample in furfuryl alcohol, the unexposed material depolymerized and the written 3D structures were carefully recovered from the developing liquid. Complex structures that are difficult, at best, to produce by other techniques, such as freely rotating interlocked rings or log pile-type structures, were easily fabricated using this 3D patterning approach (FIG. 9).

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A composition comprising at least one reversibly crosslinked polymer and at least one fixing molecule,
    wherein the at least one reversibly crosslinked polymer comprises at least one crosslink,
    wherein the at least one crosslink is formed by a reversible crosslinking reaction and comprises at least one chemical group that may react with the fixing molecule,
    wherein the reaction between the fixing molecule and the at least one chemical group of the at least one crosslink prevents the at least one crosslink from undergoing the reverse crosslinking reaction,
    wherein the composition optionally further comprises at least one photoinitiator.

2. The composition of claim 1,
    wherein the at least one crosslink comprises an adduct,
    wherein the adduct is formed by a Diels-Alder reaction between a diene-containing reactant and a dienophile-containing reactant, and
    wherein the at least one chemical group of the crosslink is the double bond formed by the Diels-Alder reaction.

3. The composition of claim 2, wherein the diene-containing reactant comprises a diene selected from the group consisting of furan, cyclopentadiene, fulvene, anthracene, acyclic cis-1,3-butadiene, and combinations thereof.

4. The composition of claim 2, wherein the dienophile-containing reactant comprises a dienophile selected from the group consisting of maleimide, cyclopentadiene, cyanoethene, and combinations thereof.

5. The composition of claim 1, wherein the reaction between the fixing molecule and the at least one chemical group of the at least one crosslink is catalyzed, triggered or induced by electromagnetic irradiation.

6. The composition of claim 1, wherein the fixing molecule comprises a thiol group.

7. The composition of claim 1, wherein the photoinitiator comprises a Type (I) or Type (II) photoinitiator.

8. A method of photofixing a section of a light sensitive material, comprising the steps of:
    providing a light sensitive material comprising at least one reversibly crosslinked polymer and at least one fixing molecule,
        wherein the at least one reversibly crosslinked polymer comprises at least one reversible covalent crosslink,
        wherein the material optionally further comprises at least one photoinitiator;
    exposing a section of the material to electromagnetic radiation for a given period of time and at given intensity as to induce a fixing reaction between the at least one reversible covalent crosslink and the at least one fixing molecule, wherein the fixing reaction causes a covalent modification of the at least one reversible covalent crosslink and prevents the at least one reversible covalent crosslink from undergoing the reverse crosslinking reaction, whereby the section of the light sensitive material is photofixed.

9. The method of claim 8, wherein the at least reversible covalent crosslink comprises a Diels-Alder adduct, wherein the adduct is formed by a reaction between a diene-containing reactant and a dienophile-containing reactant.

10. The method of claim 9, wherein the diene-containing reactant comprises a diene selected from the group consisting of furan, cyclopentadiene, fulvene, anthracene, acyclic cis-1,3-butadiene, and combinations thereof.

11. The method of claim 9, wherein the dienophile-containing reactant comprises a dienophile selected from the group consisting of maleimide, cyclopentadiene, cyanoethene, and combinations thereof.

12. The method of claim 8, wherein the fixing molecule comprises a thiol group.

13. The method of claim 8, wherein the photoinitiator comprises a Type (I) or Type (II) photoinitiator.

14. The method of claim 13, wherein the removing of the depolymerized material of step (v) comprises solvent extraction, vacuum treatment, heating, and combinations thereof.

15. A method of patterning an article, wherein the article comprises a light sensitive material, wherein the method comprises the steps of:
(i) providing a first light sensitive composition comprising at least one reversibly crosslinked polymer and at least one fixing molecule,
wherein the at least one reversibly crosslinked polymer comprises at least one reversible covalent crosslink,
wherein the composition optionally further comprises at least one photoinitiator;
(ii) exposing a section of the first light sensitive composition to electromagnetic radiation for a given period of time and at given intensity as to induce a fixing reaction between the at least one reversible covalent crosslink and the fixing molecule,
wherein the fixing reaction causes a covalent modification of the at least one reversible covalent crosslink and prevents the at least one reversible covalent crosslink from undergoing the reverse crosslinking reaction,
thereby generating an article wherein the section of the first light sensitive composition is photofixed;

(iii) optionally performing the steps of:
providing at least one additional light sensitive composition comprising at least one reversibly crosslinked polymer and at least one fixing molecule, wherein the at least one reversibly crosslinked polymer comprises at least one reversible covalent crosslink, wherein the composition optionally further comprises at least one photoinitiator;
contacting the at least one additional light sensitive composition with the article of step (ii) as to generate a modified article;
exposing a section of the modified article to electromagnetic radiation for a given period of time and at given intensity as to induce a fixing reaction between the at least one reversible covalent crosslink and the fixing molecule, wherein the fixing reaction causes a covalent modification of the at least one reversible covalent crosslink and prevents the at least one reversible covalent crosslink from undergoing the reverse crosslinking reaction,
whereby the section of the modified article material is photofixed; and,
repeating step (iii) until an article of desired shape and composition is prepared;
(iv) submitting the article of step (ii) or (iii) to a depolymerization process which induces the material that is not photofixed to undergo a reverse crosslinking reaction, thereby generating depolymerized material; and,
(v) removing the depolymerized material from the article, thereby generating pattern features in the article.

16. The method of claim 15, wherein the at least one reversible covalent crosslink comprises a Diels-Alder adduct, wherein the adduct is formed by a reaction between a diene-containing reactant and a dienophile-containing reactant.

17. The method of claim 16, wherein the diene-containing reactant comprises a diene selected from the group consisting of furan, cyclopentadiene, fulvene, anthracene, acyclic cis-1,3-butadiene, and combinations thereof.

18. The method of claim 16, wherein the dienophile-containing reactant comprises a dienophile selected from the group consisting of maleimide, cyclopentadiene, cyanoethene, and combinations thereof.

19. The method of claim 15, wherein the fixing molecule comprises a thiol group.

20. The method of claim 15, wherein the photoinitiator comprises a Type (I) or Type (II) photoinitiator.

21. The method of claim 15, wherein the depolymerization process of step (iv) comprises heating, cooling, application of electromagnetic radiation, vacuum treatment, solvent extraction, and combinations thereof.

* * * * *